United States Patent
Kato et al.

(10) Patent No.: US 9,812,315 B2
(45) Date of Patent: Nov. 7, 2017

(54) TREATING SOLUTION FOR ELECTRONIC PARTS, AND PROCESS FOR PRODUCING ELECTRONIC PARTS

(71) Applicant: FINE POLYMERS CORPORATION, Toyko (JP)

(72) Inventors: Toshitada Kato, Noda (JP); Naoya Sato, Noda (JP); Shigeru Kamon, Noda (JP); Koichiro Ogata, Noda (JP)

(73) Assignee: FINE POLYMERS CORPORATION, Tokyo (JP)

( * ) Notice: Subject to any disclaimer, the term of this patent is extended or adjusted under 35 U.S.C. 154(b) by 0 days.

(21) Appl. No.: 14/670,785

(22) Filed: Mar. 27, 2015

(65) Prior Publication Data

US 2015/0279654 A1 Oct. 1, 2015

(30) Foreign Application Priority Data

Mar. 29, 2014 (JP) .................. 2014-070641

(51) Int. Cl.
*H01L 21/02* (2006.01)
*C11D 3/34* (2006.01)
(Continued)

(52) U.S. Cl.
CPC .......... *H01L 21/0206* (2013.01); *C09K 13/08* (2013.01); *C11D 1/02* (2013.01); *C11D 3/042* (2013.01); *C11D 3/187* (2013.01); *C11D 3/2096* (2013.01); *C11D 3/28* (2013.01); *C11D 3/349* (2013.01); *C11D 3/3481* (2013.01); *C11D 11/0047* (2013.01); *H01L 21/31111* (2013.01)

(58) Field of Classification Search
CPC ........... H01L 21/0206; H01L 21/31111; C11D 3/3481; C11D 3/2096; C11D 3/28; C11D 3/349; C11D 3/187; C11D 11/0047; C11D 3/042; C11D 1/02; C09K 13/08
See application file for complete search history.

(56) References Cited

U.S. PATENT DOCUMENTS

| | | | | |
|---|---|---|---|---|
| 6,887,597 B1 * | 5/2005 | Yang | ........................ | B08B 9/032 134/22.1 |
| 2003/0180667 A1 * | 9/2003 | Takano | .................... | G03F 7/168 430/311 |

(Continued)

FOREIGN PATENT DOCUMENTS

| JP | 2008-0270458 A | * | 11/2008 |
|---|---|---|---|
| JP | 2013-055087 A | * | 3/2013 |

(Continued)

Primary Examiner — Anita Alanko
(74) Attorney, Agent, or Firm — Birch, Stewart, Kolasch & Birch, LLP

(57) ABSTRACT

The invention provides an aqueous solution capable of selectively protecting a nitrogen-containing silicon compound from corrosion by a treating solution for etching, cleaning or the like, etching oxygen-containing, carbon-containing silicon in particular, and making a large etch rate difference between a nitrogen-containing silicon compound and an oxygen-containing silicon compound, and a process for producing electronic parts as well.

The invention is embodied by a treating solution for electronic parts that is an aqueous solution containing one or two or more of anionic surface active agents represented by the following formulae (1), (2) and (3), and a process for producing an electronic part.

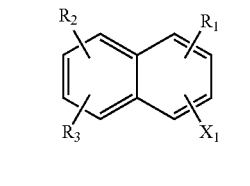

(1)

wherein $R_1$, $R_2$, and $R_3$ stands for hydrogen or an alkyl or alkylene group having 1 to 4 carbon atoms, and $X_1$ stands for a functional group capable of becoming an anionic ion.

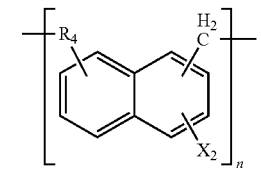

(2)

wherein $R_4$ stands for hydrogen or an alkyl or alkylene group having 1 to 4 carbon atoms, $X_2$ stands for a functional group capable of becoming an anionic ion, and n stands for a natural number of greater than 2.

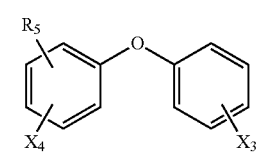

(3)

wherein $R_5$ stands for hydrogen or an alkyl or alkylene group having 1 to 4 carbon atoms, and $X_3$, and $X_4$ stands for a functional group capable of becoming an anionic ion.

18 Claims, No Drawings

(51) Int. Cl.
- *C11D 3/20* (2006.01)
- *C11D 3/28* (2006.01)
- *C11D 3/18* (2006.01)
- *C11D 11/00* (2006.01)
- *C09K 13/08* (2006.01)
- *C11D 3/04* (2006.01)
- *H01L 21/311* (2006.01)
- *C11D 1/02* (2006.01)

(56) References Cited

U.S. PATENT DOCUMENTS

| | | | | |
|---|---|---|---|---|
| 2004/0053170 A1* | 3/2004 | Ijima | ............... | G03F 7/0382 430/311 |
| 2005/0250330 A1* | 11/2005 | Chen | ............... | G03F 1/144 438/689 |
| 2005/0250660 A1* | 11/2005 | Takashima | ............ | C11D 3/042 510/176 |
| 2006/0249482 A1* | 11/2006 | Wrschka | ............... | C09G 1/02 216/88 |
| 2008/0026583 A1* | 1/2008 | Hardy | ............... | B24B 37/044 438/693 |
| 2010/0015807 A1* | 1/2010 | Kim | ............... | C09G 1/02 438/693 |
| 2011/0081780 A1* | 4/2011 | Shida | ............... | C09G 1/02 438/693 |
| 2015/0075850 A1* | 3/2015 | Ohwada | ............... | H05K 3/067 174/257 |
| 2016/0032186 A1* | 2/2016 | Chen | ............... | C23G 1/02 252/79.3 |

FOREIGN PATENT DOCUMENTS

| | | | |
|---|---|---|---|
| KR | 20140025817 A | * | 3/2014 |
| WO | WO 02/089193 A1 | | 11/2002 |
| WO | WO 2014-069517 A1 | * | 5/2014 |

\* cited by examiner

TREATING SOLUTION FOR ELECTRONIC PARTS, AND PROCESS FOR PRODUCING ELECTRONIC PARTS

FIELD OF THE INVENTION

The present invention relates to a treating solution for electronic parts that makes it possible to remove silicon oxide or the like in a process of producing electronic parts such as semiconductors and display devices, and selectively protect nitrogen-containing silicon compounds in an etching step, and a process for producing an electronic part using this treating solution as well.

BACKGROUND ART

In order to form Large scale integration circuit (LSIs), and thin-film transistors (TFTs) for liquid crystal displays on glass substrates, there has been technology well established in which a photoresist is used to form the necessary device structure or circuit structure pattern that is in turn etched in an etching step for removal of unnecessary portions thereby obtaining the desired device structure or circuit structure.

The device structure or circuit structure to be formed may have a variety of configurations depending on the desired electronic device. In recent years, however, a variety of structures using silicon nitride film materials have also been under study. Typically in the process for producing non-volatile memory devices like flash memory devices, a gate insulating film pattern and a gate electrode pattern are formed on a semiconductor substrate. These electrode structures generally comprise an electrode material that is made conductive by incorporating a dopant in polysilicon and an insulating film formed of $SiO_2$, SiN or SiON. When the electrode structure further includes a floating gate and a control gate, there is an insulating layer formed of ONO (oxide-nitride-oxide), SiON or SiN so as to insulate them. To this end there is a step provided in which the semiconductor substrate is etched across the gate electrode pattern to form a trench.

For a DRAM memory cell structure too, the structure of a silicon nitride film is adopted. Typically in a stack type memory cell, a device isolation area is formed on a P-type silicon substrate to form a gate oxide film and a gate electrode. Then, a source/drain area is formed, and an insulating film is further formed by CVD or the like, with a contact provided on it. Then, there is a polycrystalline silicon film formed for electric conductivity, which film is in turn patterned to form a lower electrode of a capacitor. Then, a thin silicon nitride film is formed by CVD all over the surface to provide the capacitor with an upper electrode. Then, a BPSG film (insulating film) is formed by CVD, and a contact for connection to a bit line for data retrieval is opened using known photolithographic/etching technology. Finally, an electric conductive film and a BPSG (insulating film) are formed to obtain a stack type DRAM memory cell.

The silicon nitride film is also used for the formation of a photodiode proximity structure of a conventional CCD imaging device including a device isolation mechanism having an STI structure. Specifically, a silicon substrate is provided on it with an insulating film comprising a silicon oxide film, and the insulating film is provided on it with a protective film comprising a silicon nitride film or the like. This protective film is provided on it with a resist pattern having an opening or aperture in the area having the device isolation trench formed in it. With this resist pattern as a mask, the insulating film and protective film are etched to form an opening through which the upper surface of the silicon substrate is exposed. Note here that the resist pattern will be removed by asking or the like after the formation of the opening. Then, the protecting film is used as a mask for etching of the silicon substrate thereby forming a device isolation trench.

Further, the silicon nitride film structure is also adopted for a pixel-driving thin-film transistor (TFT) or the like in a display device such as a liquid crystal device. For instance, the ohmic contact layer of a channel portion of the thin-film transistor is dry etched, after which a passivation layer in a silicon nitride film form is locally provided.

Thus, the silicon nitride film is increasingly used for various electronic devices. One of the reasons is the fact that such silicon nitride films differ from mask materials composed mainly of silicon such as silicon oxide and oxygen in terms of anticorrosion capability. This capability makes sure a silicon nitride layer is used as a stopper layer for dry etching, a corrosion preventive layer, a mask or the like in the production of semiconductor devices. The silicon nitride film may be used in combination with a low-dielectric-constant insulating material of the silicon oxide type represented by Low-k material or the like and containing oxygen and other elements such as fluorine and carbon for patterning or acquiring selective etching capability when they are used as a mask.

However, a problem with such etching or cleaning steps is that when the etching solution and cleaning solution used corrode the aforesaid compounds, the silicon film containing nitrogen is also more or less corroded. In particular, recent microstructures of devices are likely to be subject to noticeable adverse influences even from a slight corrosion; so there is mounting demand for the development of more advanced corrosion preventive technology.

Translation of PCT Application No. 2004-528716 goes deep into adverse influences of etch selectivity on such materials as silicon oxides in the step of wet etching materials containing silicon and nitrogen such as silicon nitride and silicon oxynitride. However, what is considered there is a problem with the etching of such a material as silicon oxide at the time of etching a material containing silicon and nitrogen, and that publication says or suggests nothing about the reverse phenomenon whatsoever. In addition, the aforesaid problem is only solved by performing etching in a dilute aqueous solution containing hydrofluoric acid (HF) in a concentration range of 0.001M to 0.1M at a temperature of 25° C. to 90° C. In other words, the temperature and concentration of the aqueous solution of hydrofluoric acid are nothing else than defined. For this reason, any study of prevention of corrosions by the introduction of other compound elements is not made at all.

PRIOR ART

Patent Publication

[Patent Publication 1] Translation of PCT Application No. 2004-528716

SUMMARY OF THE INVENTION

Objects of the Invention

The present invention has for its objects to provide an aqueous solution capable of (1) selectively protecting a nitrogen-containing silicon compound from corrosions caused by chemicals used for various treatments such as etching and cleaning while, at the same time, (2) etching silicon in general, and oxygen-containing, carbon-containing silicon in particular, and (3) making a large difference in etch rate between a nitrogen-containing silicon compound and an oxygen-containing silicon compound, and a process for producing electronic parts using that aqueous solution.

How to Attain the Objects

The aforesaid objects are achievable by the inventions embodied as follows.

[1] A treating solution for electronic parts, which is an aqueous solution containing one or two or more of anionic surface active agents having the following formulae (1), (2) and (3).

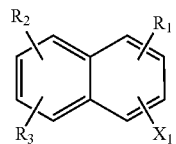
(1)

In Formula (1), $R_1$, $R_2$, and $R_3$ stands for hydrogen or an alkyl or alkylene group having 1 to 4 carbon atoms, and $X_1$ stands for a functional group capable of becoming an anionic ion.

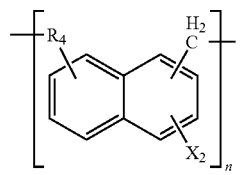
(2)

In Formula (2), $R_4$ stands for hydrogen or an alkyl or alkylene group having 1 to 4 carbon atoms, $X_2$ stands for a functional group capable of becoming an anionic ion, and n stands for a natural number of 2 or greater.

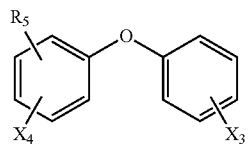
(3)

In Formula (3), $R_5$ stands for hydrogen or an alkyl or alkylene group having 1 to 4 carbon atoms, and $X_3$, and $X_4$ stands for a functional group capable of becoming an anionic ion.

[2] The treating solution for electronic parts as recited in [1], wherein said aqueous solution has a pH value of 2 to 6.
[3] The treating solution for electronic parts as recited in [1] or [2], which contains hydrofluoric acid in an amount of 0.001 to 50 mass %.
[4] The treating solution for electronic parts as recited in any one of [1] to [3], wherein said hydrofluoric acid is obtained by dissolution of a water-soluble fluoride salt.
[5] The treating solution for electronic parts as recited in any one of [1] to [4], which contains a cyclic compound having an occupied area smaller than a naphthalene ring.
[6] The treating solution for electronic parts as recited in [5], wherein said cyclic compound is represented by the following formulae (4), (5), (6) or (7).

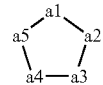
(4)

In Formula (4), $a_1$, $a_2$, $a_3$, $a_4$, and $a_5$ stands for any one or more of a carbon atom, a nitrogen atom, an oxygen atom, a sulfur atom and a phosphorus atom, wherein these 5 constituting elements form a cyclic structure by having any chemical bond between neighboring constituting elements, providing a cyclic compound showing aromaticity under conditions under which it is used. Further, $a_1$, $a_2$, a3, $a_4$, and $a_5$ may bond to a functional group, or may be a polymer thereof.

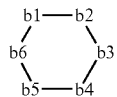
(5)

In Formula (5), $b_1$, $b_2$, $b_3$, $b_4$, $b_5$, and $b_6$ stands for any one or more of a carbon atom, a nitrogen atom, an oxygen atom, a sulfur atom and a phosphorus atom, wherein these 6 constituting elements form a cyclic structure by having any chemical bond between neighboring constituting elements, providing a cyclic compound showing aromaticity under conditions under which it is used. Further, $b_1$, $b_2$, $b_3$, $b_4$, $b_5$, and $b_6$ may bond to a functional group, or may be a polymer thereof.

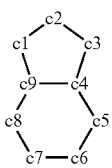
(6)

In Formula (6), $c_1$, $c_2$, $c_3$, $c_4$, $c_5$, $c_6$, $c_7$, $c_8$, and $c_9$ stands for any one or more of a carbon atom, a nitrogen atom, an oxygen atom, a sulfur atom and a phosphorus atom, wherein these 9 constituting elements form a cyclic structure by having any chemical bond between neighboring constituting elements, providing a cyclic compound showing aromaticity under conditions under which it is used. Further, $c_1$, $c_2$, $c_3$, $c_4$, $c_5$, $c_6$, $c_7$, $c_8$, and $c_9$ may bond to a functional group, or may be a polymer thereof.

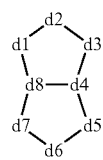
(7)

In Formula (7), $d_1$, $d_2$, $d_3$, $d_4$, $d_5$, $d_6$, $d_7$, and $d_8$ stands for any one or more of a carbon atom, a nitrogen atom, an oxygen atom, a sulfur atom and a phosphorus atom, wherein these 8 constituting elements form a cyclic structure by having any chemical bond between neighboring constituting elements, providing a cyclic compound showing aromaticity under conditions under which it is used. Further, $d_1$, $d_2$, $d_3$, $d_4$, $d_5$, $d_6$, $d_7$, and $d_8$ may bond to a functional group, or may be a polymer thereof.

[7] The treating solution for electronic parts as recited in [5] or [6], which contains said cyclic compound in an amount of 0.001 mass % or greater.

[8] The treating solution for electronic parts as recited in any one of [1] to [6], which contains said anionic surface active agent in an amount of 0.001 mass % to 2 mass %.

[9] The treating solution for electronic parts as recited in any one of [1] to [8], wherein said aqueous solution contains a buffer comprising a weak acid and an alkali species.

[10] The treating solution for electronic parts as recited in any one of [1] to [9], which further contains an organic solvent miscible with water.

[11] The treating solution for electronic parts as recited in any one of [1] to [10], which is used with an electronic part including a structure having a nitrogen-containing silicon compound as a component material, and a structure having a nitrogen-free silicon compound as a component material.

[12] A process for producing electronic parts, which includes a step of etching or cleaning an electronic part, using the treating solution for electronic parts as recited in any one of [1] to [10].

[13] The process for producing electronic parts as recited in [12], in which said electronic part includes a structure having a nitrogen-containing silicon compound as a component material, and a structure having a nitrogen-free silicon compound as a component material.

Advantages of the Invention

According to the invention, it is possible to provide a treating solution capable of selectively protecting a nitrogen-containing silicon compound from corrosions caused by chemical solutions or treating solutions in general, and a chemical solution containing an acid such as hydrofluoric acid in particular while, at the same time, etching a nitrogen-free silicon compound containing oxygen and carbon, and making a large difference in etch rates between a nitrogen-containing silicon compound and a nitrogen-free silicon compound containing oxygen and carbon, and a process for producing electronic parts using this aqueous solution as well.

MODE FOR CARRYING OUT THE INVENTION

The treating solution for electronic parts according to the invention is an aqueous solution that contains one or two or more of the anionic surface active agents or surfactants represented by the aforesaid general formulae (1), (2) and (3). The application of such a treating solution to etching, cleaning or other treatment(s) of electronic parts makes sure selective prevention of corrosions of nitrogen-containing silicon compounds. If ingredients capable of achieving functions depending on the purpose of electronic parts are added to the present treating solution, it is then possible to use the present treating solution for etching, cleaning or other necessary treatments.

The compounds represented by Formula (1) are now explained. Formula (1) is representative of a compound having a naphthalene skeleton with each benzene ring having substituents $R_1$ and $R_2$, and $R_3$ and $X_1$. In Formula (1), $R_1$, $R_2$, and $R_3$ stands for hydrogen, or an alkyl or alkylene group having 1 to 4 carbon atoms. The alkyl group indicated by $R_1$, $R_2$, and $R_3$ has preferably 1 to 4 carbon atoms, and may be in a straight or branched chain form. Further, the alkyl group may further have a substituent(s). Specifically but not exclusively, the alkyl group indicated by $R_1$, $R_2$, and $R_3$ includes —$CH_3$, —$CH_2CH_3$, —$CH_2$=$CH_2$, —$CH(CH_3)_2$, —$CH(CH_3)_3$, and —$CH_2CH_2CH_3$, among which preference is given to an isopropyl group —$CH(CH_3)_2$. $R_1$, $R_2$ and $R_3$ may be the same or different from one another.

$X_1$ stands for a functional group that becomes an anionic ion. It follows that the compound of Formula (1) functions as an anionic surface active agent by way of the aforesaid hydrophobic groups $R_1$ to $R_3$ and the hydrophilic group $X_1$. In other words, $X_1$ is preferably a functional group capable of functioning as such a surfactant. Specifically but not exclusively, preference is given to any one of —$SO_3^-$, —$OSO_3^-$, —$COO^-$, —$P(O^-)_2O$, —$CH_2SO_3^-$ and —$CH_2COO^-$, among which any one of —$SO_3^-$, —$OSO_3^-$ or —$P(O^-)_2O$ is most preferred.

Specific examples of the compound represented by Formula (1) are naphthalenesulfonic acid, alkyl naphthalenesulfonic acid, sodium alkyl naphthalene sulfonate, naphthalene carboxylate, 2-methyl-1-naphthalenecarboxylic acid, monoisopropyl naphthalene-sulfonic acid, diisopropyl naphthalenesulfonic acid, triisopropyl naphthalenesulfonic acid, dibutyl naphthalenesulfonic acid, etc.

The compounds represented by Formula (2) are now explained. The compound of Formula (2) includes monomers having a naphthalene skeleton, wherein they are linked together by way of "—$CH_2$—" and polymerized. One phenyl ring of naphthalene includes a substituent $R_4$, while another phenyl ring includes a substituent $X_2$. The substituents $R_4$ and $X_2$ are synonymous with the aforesaid $R_1$ and $X_1$. The small letter n indicative of a number of repetitions stands for a natural number of 2 or greater; however, n is usually of the order 2 to 50 although not limited to it.

Specific examples of the compound represented by Formula (2) are a naphthalenesulfonic acid/formalin condensate or the like.

The compounds represented by Formula (3) are now explained. The compound of Formula (3) includes a diphenyl ether skeleton, wherein the benzene rings each include substituents $R_5$, $X_3$ and $X_4$. The substituents $R_4$ and $X_3$ may be exclusively present in one or both of the benzene rings. The substituents $R_5$, $X_3$ and $X_4$ are synonymous with the aforesaid $R_1$ and $X_1$, and $X_3$ and $X_4$ may be the same or different from each other.

Specific examples of the compound represented by Formula (3) include an alkyldiphenyl ether sulfonic acid and its salt such as alkyldiphenyl ether sodium sulfonate and an alkyldiphenyl ether sodium disulfonate, a dodecyldiphenyl ether disulfonic acid and its salt such as dodecyldiphenyl ether calcium disulfonate, etc.

The compounds represented by Formulae (1), (2) and (3) may be used alone or in combination of two or more, or all of them may be used. Among others, the compound of Formula (1) is most preferred; it may be used alone or in combination with other compound(s).

In use, the compounds of the invention represented by Formulae (1), (2) and (3) are added to a treating or processing solution for electronic devices such as an etching solution, a cleaning solution, and a rinsing solution. They are added to it in an amount of 0.001 mass % or greater, preferably 0.001 to 2 mass %, and more preferably 0.001 to 0.5 mass % per the total amount of the treating solution to which they are to be added. Too less causes the anticorrosion effect to get slim, and too much is less cost-effective because the time taken for rinsing gets longer although it has no or little adverse influence on that effect.

In use, the additives of the invention are added to the treating solution for electronic devices as described above. Such a treating solution is preferably an aqueous solution in general and an acidic solution in particular whose pH is less than 7, and preferably less than 6. There is no particular limitation imposed on such an acidic solution provided that it contains an acid used commonly in the process of producing electronic devices such as semiconductors and liquid crystal devices. There is the specific mention of an aqueous solution containing hydrofluoric acid, hydrochloric acid, phosphoric acid, nitric acid, or a combination of two or more of these acids, optionally with an aqueous solution of hydrogen peroxide added to it. The concentration of these acids may be within the known concentration range used for this type treating solution, and may be selected depending on the functions and performance of the necessary solution.

Especially in the invention, preference is given to a treating solution used for the treatment of a device including a nitrogen-free, oxygen-containing silicon compound and a nitrogen-containing silicon compound now that the invention has a specific feature of having a high etch ratio for both the compounds. Such a treating solution is preferably an aqueous solution containing hydrofluoric acid in an amount of preferably 0.001 to 50 mass %, and more preferably 0.01 to 20 mass %.

Although hydrofluoric acid may be added to the treating solution in the form of hydrogen fluoride, it is preferable to use hydrofluoric acid by itself. There may be water-soluble fluoride salts or the like used, among which ammonium fluoride is most preferred. Instead of the ammonium fluoride that is usually a salt represented by $NH_4F$, it is possible to use ammonium hydrogen fluoride represented by $(NH_4)HF_2$. Usually, as ammonium fluoride is dissolved in the treating solution, it will cause the treating solution to contain hydrofluoric acid, ammonium ions and ammonia derived from it in equimolecular amounts. The content of ammonium fluoride is preferably 0.00185 to 40 mass %, and more preferably 0.00185 to 37 mass %. Further, hydrofluoric acid may be added alone or in combination with other additive(s) in such a way as to become excessive.

In addition to the anionic surfactants represented by the aforesaid Formulae (1), (2) and (3), it is herein preferable for the treating solution to contain a molecule having an occupied area smaller than those of Formulae (1), (2) and (3), i.e., a cyclic compound in which the occupied area of a cyclic structure moiety is smaller than the molecular area of naphthalene. Note here that the "molecular area" refers to the occupied area of a cyclic structure moiety. As the compound having a smaller occupied area is introduced in the treating solution, it would be located and arranged on the surface and surroundings of what is to be protected in such a way as to fill up gaps in the compounds of Formulae (1), (2) and (3), contributing more to enhanced protective and anticorrosive actions on chemicals. When the aforesaid molecular or occupied area is unknown, it is preferable to use a compound in which the number of elements forming a basic skeleton is less than that of naphthalene. Although the coexisting compounds of Formulae (1), (2) and (3) may be used for comparing area size, it is convenient to use naphthalene whose size is generally equal to or smaller than their size.

These compounds should preferably show aromaticity under conditions under which they are used. Note here that the compounds are not always required to have aromaticity in themselves; that aromaticity may be developed by changes in the electron state of some or all of the constituting elements forming the compounds under conditions under which they are used. The changes in the electron state may be an exergonic process or an endergonic process irrespective of the type of process. There is the general mention of ionization by dissociation, binding changes by chemical reactions, extraneous light irradiation, electromagnetic wave irradiation, application of voltages, etc.

Further, these compounds may contain hetero atoms in their cyclic structure, and the constituting elements of the cyclic structure may bond to other elements than those forming the cyclic structure. To put it another way, the cyclic compounds may contain functional groups irrespective of their type. Even if water solubility become poor by the introduction of functional groups, there is likelihood that solubilization may take place by way of the aforesaid compounds (1), (2) and (3). In no event of dissolution, however, may a suitable organic solvent be added.

These compounds may be polymerized via any functional elements or functional groups on their molecular structure. It is here to be noted that the polymer is not necessarily formed already at the time of solution formulation; it may be formed by way of any chemical reaction after formulation, or before or during use. The "any chemical reaction" here refers to dehydration condensation, electrolytic polymerization or the like regardless of the type of chemical reaction. That chemical reaction may be either an exergonic process or an endergonic process.

Although there is no particular limitation on such cyclic compounds with the proviso that they satisfy the aforesaid conditions, it is preferable to use a five-membered ring compound alone, a six-membered ring compound alone, a five-membered ring compound condensed with a four-membered ring compound, and a five-membered ring compound condensed with a six-membered ring compound, and particular preference is given to a compound having an indan skeleton as represented by Formula (6) or a compound represented by Formula (4). Optionally, it is also possible to use a compound having five-membered ring compounds combined with each other.

Referring to the cyclic compound of Formula (4), the constituting element $a_1$, $a_2$, $a_3$, $a_4$, and $a_5$ stands for at least one of carbon, nitrogen, oxygen, sulfur and phosphorus atoms, and these elements provide the respective constituting elements alone or in combination of two or more. The respective constituting elements may be the same or different from each other. These five constituting elements include chemical bonds between neighboring constituting elements. Note here that the types of chemical bonds do not matter. Further, $a_1$, $a_2$, $a_3$, $a_4$, and $a_5$ may further bond to a functional group regardless of the type of functional group. This compound forms a cyclic structure by way of the aforesaid five constituting elements.

The cyclic compound of Formula (4) shows aromaticity under conditions under which it is used. The conditions under which this compound takes on aromaticity would appear to include, in addition to the aromaticity that this compound has in itself, ionization and radicalization of the elements (atoms) $a_1$, $a_2$, $a_3$, $a_4$ and $a_5$, changes in the bond type of the elements (atoms) $a_1$, $a_2$, $a_3$, $a_4$ and $a_5$, detachment of atoms or functional groups attached to the elements (atoms) $a_1$, $a_2$, $a_3$, $a_4$ and $a_5$, changes in the bond type of atoms or functional groups attached to the elements (atoms) $a_1$, $a_2$, $a_3$, $a_4$ and $a_5$, ionization and radicalization of atoms attached to the elements (atoms) $a_1$, $a_2$, $a_3$, $a_4$ and $a_5$, ionization and radicalization of functional groups attached to the elements (atoms) $a_1$, $a_2$, $a_3$, $a_4$ and $a_5$, chemical changes such as oxidization and reduction of functional groups attached to the elements (atoms) $a_1$, $a_2$, $a_3$, $a_4$ and $a_5$, and extraneous light irradiation, electromagnetic wave irradiation, application of voltages, etc. It is here to be noted that the type of, and process of development of, aromaticity does not matter.

The cyclic compounds represented by Formula (4) include pyrrole, pyrryl salts, pyrrole derivatives, phenylpyrrole, pyrrole adducts of benzene derivatives, benzene pyrrole derivative adducts, pyrrolylpridine, pyrrolylpyrimidine, pyrrolylpyridazine, pyrrolyltriazine, pyridine pyrrole derivative adducts, pyrimidine pyrrole derivative adducts, pyridazine pyrrole derivative adducts, triazole pyrrole derivative adducts, pyrrole pyridine derivative adducts, pyrrole triazine derivative adducts, pyrrole pyrimidine derivative adducts, pyrrole pyridazine derivative adducts, pyrrole triazine derivative adducts, pyrazole, pyrazolyl salts, pyrazole derivatives, phenyl-pyrazole, pyrazole adducts of benzene derivatives, benzene adducts of pyrazole derivatives, pyrazolyl-pyridine, pyridine adducts of pyrazole derivatives, pyrazole adducts of pyridine derivatives, pyrazolyl-triazine, triazine adducts of pyrazole derivatives, pyrazole adducts of triazine derivatives, pyrazolyl-pyrimidine, pyrimidine adducts of pyrazole derivatives, pyrazole adducts of pyrimidine derivatives, pyrazolyl-pyridazine, pyridazine adducts of pyrazole derivatives, pyrazole adducts of pyridazine derivatives, imidazole, imidazolyl salts, imidazole derivatives, phenylimidazole, imidazole adducts of benzene derivatives, benzene adducts of imidazole derivatives, imidazolylpyridine, pyridine adducts of imidazole derivatives, imidazole adducts of pyrimidine derivatives, imidazolylpyridine, pyridine adducts of imidazole derivatives, imidazole adducts of pyridine derivatives, imidazolyltriazine, triazine adducts of imidazole derivatives, imidazole adducts of triazine derivatives, imidazolylpyrimidine, pyrimidine adducts of imidazole derivatives, imidazole adducts of pyrimidine derivatives, imidazolylpyridazine, pyridazine adducts of imidazole derivatives, imidazole adducts of pyridazine derivatives, triazole, triazolyl salts, triazole derivatives, phenyltriazole, triazole adducts of benzene derivatives, benzene adducts of triazole derivatives, triazolylpyridine, pyridine adducts of triazole derivatives, triazole adducts of pyridine derivatives, triazolyltriazine, triazine adducts of triazole derivatives, triazole adducts of triazine derivatives, triazolylpyrimidine, pyrimidine adducts of triazole derivatives, triazole adducts of pyrimidine derivatives, triazolylpyridazine, pyridazine adducts of triazole derivatives, triazole adducts of pyridazine derivatives, tetrazole, tetrazolyl salts, tetrazole derivatives, phenyltetrazole, tetrazole adducts of benzene derivatives, benzene adducts of tetrazole derivatives, tetrazolyl-pyridine, pyridine adducts of tetrazole derivatives, tetrazole adducts of pyridine derivatives, tetrazolyl-triazine, triazine adducts of tetrazole derivatives, tetrazole adducts of triazine derivatives, tetrazolylpyrimidine, pyrimidine adducts of tetrazole derivatives, tetrazole adducts of pyrimidine derivatives, tetrazolylpyridazine, pyridazine adducts of tetrazole derivatives, tetrazole adducts of pyridazine derivatives, pentazole, pentazolyl salts, pentazole derivatives, phenylpentazole, pentazole adducts of benzene derivatives, benzene adducts of pentazole derivatives, pentazolylpyridine, pyridine adducts of pentazole derivatives, pentazole adducts of pyridine derivatives, pentazolyltriazine, triazine adducts of pentazole derivatives, pentazole adducts of triazine derivatives, pentazolylpyrimidine, pyrimidine adducts of pentazole derivatives, pentazole adducts of pyrimidine derivatives, pentazolylpyridazine, pyridazine adducts of pentazole derivatives, pentazole adducts of pyridazine derivatives, furan, furan derivatives, phenylfuran, furan adducts of benzene derivatives, benzene adducts of furan derivatives, furanylpyridine, pyridine adducts of furan derivatives, furan adducts of pyridine derivatives, furanyltriazine, triazine adducts of furan derivatives, furan adducts of triazine derivatives, furanylpyrimidine, pyrimidine adducts of furan derivatives, furan adducts of pyrimidine derivatives, furanylpyridazine, pyridazine adducts of furan derivatives, furan adducts of pyridazine derivatives, thiophene, thiophene derivatives, phenyl-thiophene, thiophene adducts of benzene derivatives, benzene adducts of thiophene derivatives, thiophenyl-pyridine, pyridine adducts of thiophene derivatives, thiophene adducts of pyridine derivatives, thiophenyl-triazine, triazine adducts of thiophene derivatives, thiophene adducts of triazine derivatives, thiophenyl-pyrimidine, pyrimidine adducts of thiophene derivatives, thiophene adducts of pyrimidine derivatives, thiophenyl-pyridazine, pyridazine adducts of thiophene derivatives, thiophene adducts of pyridazine derivatives, thiophene polymers, oxazole, oxazole derivatives, phenyloxazole, oxazole adducts of benzene derivatives, benzene adducts of oxazole derivatives, oxazolylpyridine, pyridine adducts of oxazole derivatives, oxazole adducts of pyridine derivatives, oxazolyltriazine, triazine adducts of oxazole derivatives, oxazole adducts of triazine derivatives, oxazolylpyrimidine, pyrimidine adducts of oxazole derivatives, oxazole adducts of pyrimidine derivatives, oxazolylpyridazine, pyridazine adducts of oxazole derivatives, oxazole adducts of pyridazine derivatives, thiazole, thiazole derivatives, phenyl-thiazole, thiazole adducts of benzene derivatives, benzene adducts of thiazole derivatives, thiazolyl-pyridine, pyridine adducts of thiazole derivatives, thiazole adducts of pyridine derivatives, thiazolyl-triazine, triazine adducts of thiazole derivatives, thiazole adducts of triazine derivatives, thiazolyl-pyrimidine, pyrimidine adducts of thiazole derivatives, thiazole adducts of pyrimidine derivatives, thiazolyl-pyridazine, pyridazine adducts of thiazole derivatives, thiazole adducts of pyridazine derivatives, oxadiazole, oxadiazole derivatives, phyenyloxadiazole, oxadiazole adducts of benzene derivatives, benzene adducts of oxadiazole derivatives, oxadiazolylpyridine, pyridine adducts of oxadiazole derivatives, oxadiazole adducts of pyridine derivatives, oxadiazolyltriazine, triazine adducts of oxadiazole derivatives, oxadiazole adducts of triazine derivatives, oxadiazolylpyrimidine, pyrimidine adducts of oxadiazole derivatives, oxadiazole adducts of pyrimidine derivatives, oxadiazolylpyridazine, pyridazine adducts of oxadiazole derivatives, oxadiazole adducts of pyridazine derivatives, etc., and there is the specific mention of 1H-imidazole, 1-methylimidazole, 2-methylimidazole, 1,2-dimethylimidazole, 2-phenylimidazole, 1H-pyrazole, 1,2,3-triazole, 1,2,4-triazole, 1,2,3,4-tetrazole, 5-phenyltetrazole, imidazoline, histidine, terthiophene, polythiophene or the like.

By way of example but not by way of limitation, typical specific structures of the above-exemplified cyclic compounds of Formula (4) are given below.

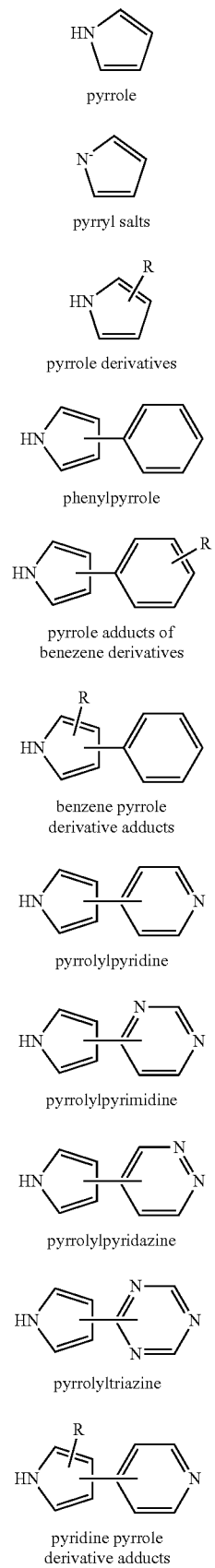

pyrrole (I-A1)

pyrryl salts (I-A2)

pyrrole derivatives (I-A3)

phenylpyrrole (I-A4)

pyrrole adducts of benezene derivatives (I-A5)

benzene pyrrole derivative adducts (I-A6)

pyrrolylpyridine (I-A7)

pyrrolylpyrimidine (I-A8)

pyrrolylpyridazine (I-A9)

pyrrolyltriazine (I-A10)

pyridine pyrrole derivative adducts (I-A11)

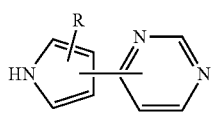

pyrimidine pyrrole derivative adducts (I-A12)

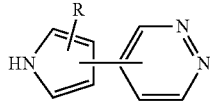

pyridazine pyrrole derivative adducts (I-A13)

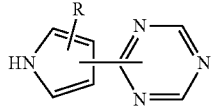

triazole pyrrole derivative adducts (I-A14)

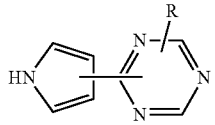

pyrrole triazine derivative adducts (I-A15)

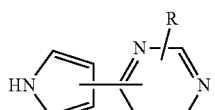

pyrrole pyrimidine derivative adducts (I-A16)

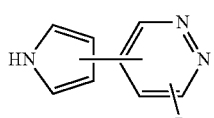

pyrrole pyridazine derivative adducts (I-A17)

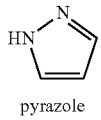

pyrazole (I-B1)

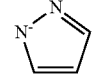

pyrazolyl salts (I-B2)

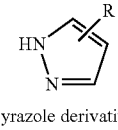

pyrazole derivatives (I-B3)

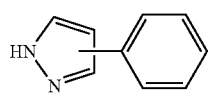
phenylpyrazole (I-B4)

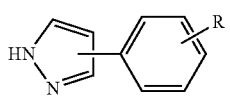
pyrazole adducts of benezene derivatives (I-B5)

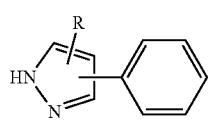
benzene adducts of pyrazole derivatives (I-B6)

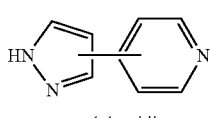
pyrazolylpyridine (I-B7)

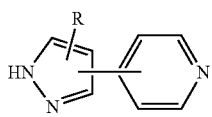
pyridine adducts of pyrazole derivatives (I-B8)

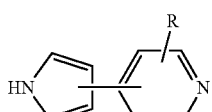
pyrazole adducts of pyridine derivatives (I-B9)

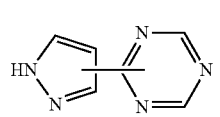
pyrazolyltriazine (I-B10)

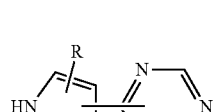
triazine adducts of pyrazole derivatives (I-B11)

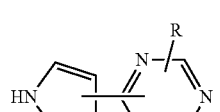
pyrazole adducts of triazine derivatives (I-B12)

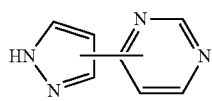
pyrazolylpyrimidine (I-B13)

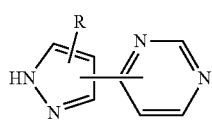
pyrimidine adducts of pyrazole derivatives (I-B14)

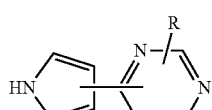
pyrazole adducts of pyrimidine derivatives (I-B15)

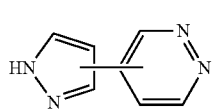
pyrazolylpyridazine (I-B16)

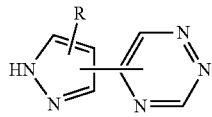
pyridazine adducts of pyrazole derivatives (I-B17)

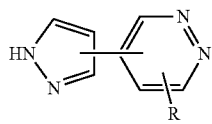
pyrazole adducts of pyridazine derivatives (I-B18)

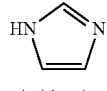
imidazole (I-C)

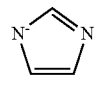
imidazolyl salts (I-C1)

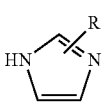
imidazole derivatives (I-C2)

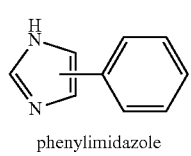
phenylimidazole (I-C3)

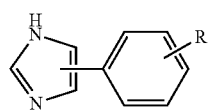

imidazole adducts of
benzene derivatives
(I-C4)

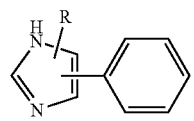

benzene adducts of
imidazole derivatives
(I-C5)

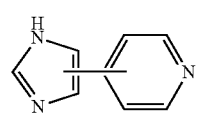

imidazolylpyridine
(I-C6)

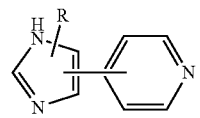

pyridine adducts of
imidazole derivatives
(I-C7)

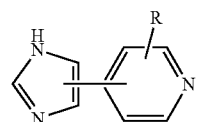

imidazole adducts of
pyridine derivatives
(I-C8)

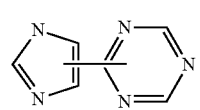

imidazolyltriazine
(I-C9)

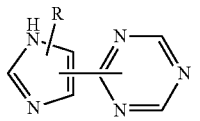

triazine adducts of
imidazole derivatives
(I-C10)

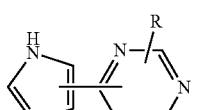

imidazole adducts of
triazine derivatives
(I-C11)

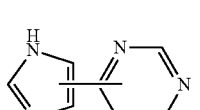

imidazolylpyrimidine
(I-C12)

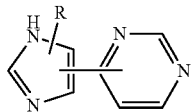

pyrimidine adducts of
imidazole derivatives
(I-C13)

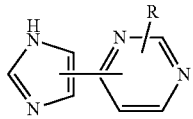

imidazole adducts of
pyrimidine derivatives
(I-C14)

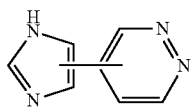

imidazolylpyridazine
(I-C15)

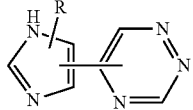

pyridazine adducts of
imidazole derivatives
(I-C16)

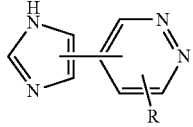

imidazole adducts of
pyridazine derivatives
(I-C17)

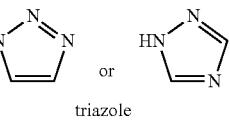

triazole
(I-D1)

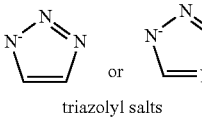

triazolyl salts
(I-D2)

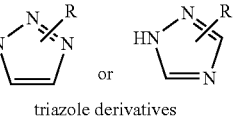

triazole derivatives
(I-D3)

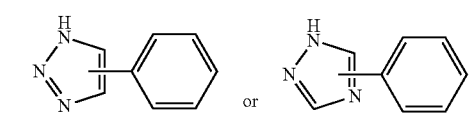

phenyltriazole
(I-D4)

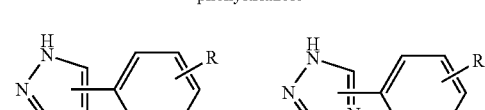

triazole adducts of benzene derivatives
(I-D5)

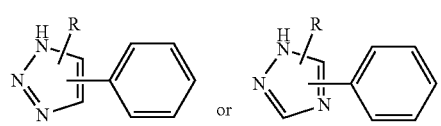
benzene adducts of triazole derivatives (I-D6)

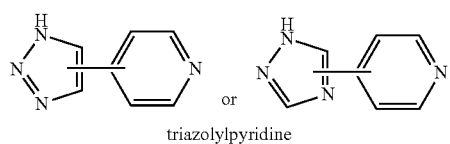
triazolylpyridine (I-D6)

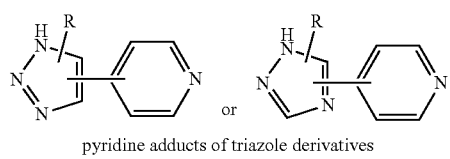
pyridine adducts of triazole derivatives (I-D7)

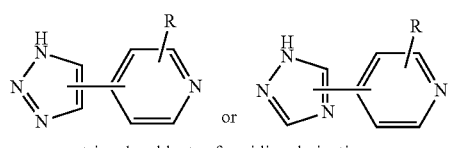
triazole adducts of pyridine derivatives (I-D8)

triazolyltriazine (I-D9)

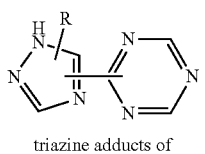
triazine adducts of triazole derivatives (I-D10)

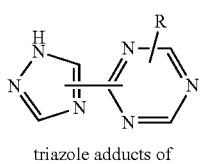
triazole adducts of triazine derivatives (I-D11)

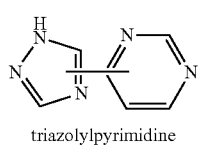
triazolylpyrimidine (I-D12)

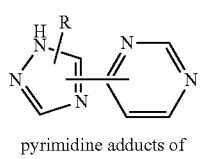
pyrimidine adducts of triazole derivatives (I-D13)

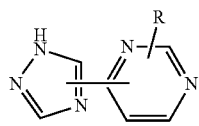
triazole adducts of pyrimidine derivatives (I-D14)

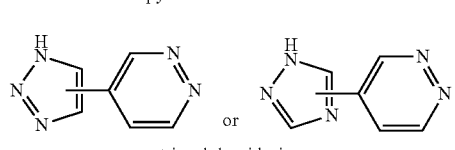
triazolylpyridazine (I-D15)

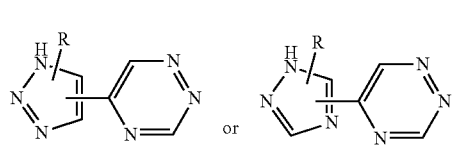
pyridazine adducts of triazole derivatives (I-D16)

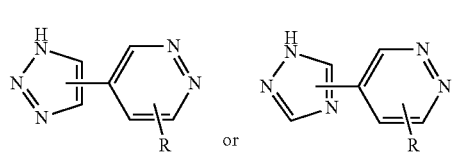
triazole adducts of pyridazine derivatives (I-D17)

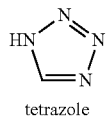
tetrazole (I-E1)

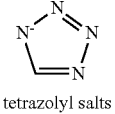
tetrazolyl salts (I-E2)

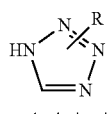
tetrazole derivatives (I-E3)

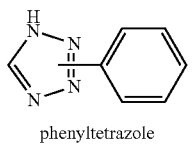
phenyltetrazole (I-E4)

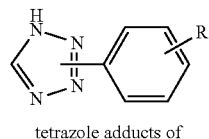
tetrazole adducts of benzene derivatives (I-E5)

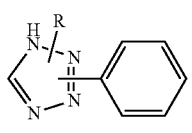
benzene adducts of tetrazole derivatives (I-E6)

-continued

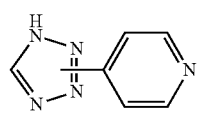
tetrazolylpyridine (I-E7)

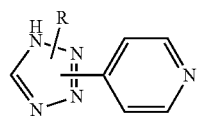
pyridine adducts of
tetrazole derivatives (I-E8)

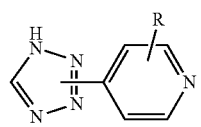
tetrazole adducts of
pyridine derivatives (I-E9)

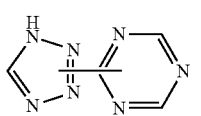
tetrazolyltriazine (I-E10)

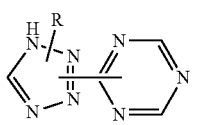
triazine adducts of
tetrazole derivatives (I-E11)

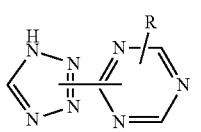
tetrazole adducts of
triazine derivatives (I-E12)

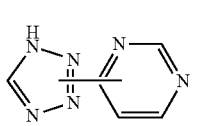
tetrazolylpyrimidine (I-E13)

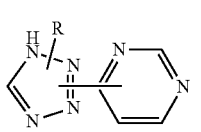
pyrimidine adducts of
tetrazole derivatives (I-E14)

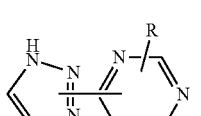
tetrazole adducts of
pyrimidine derivatives (I-E15)

-continued

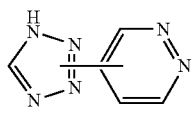
tetrazolylpyridazine (I-E16)

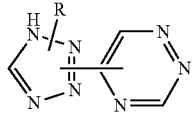
pyridazine adducts of
tetrazole derivatives (I-E17)

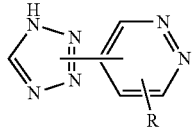
tetrazole adducts of
pyridazine derivatives (I-E18)

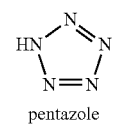
pentazole (I-F1)

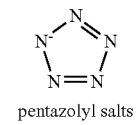
pentazolyl salts (I-F2)

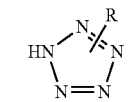
pentazole derivatives (I-F3)

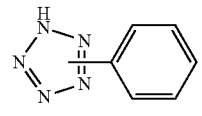
phenylpentazole (I-F4)

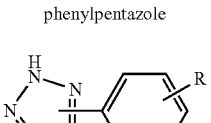
pentazole adducts of
benzene derivatives (I-F5)

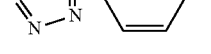
benzene adducts of
pentazole derivatives (I-F6)

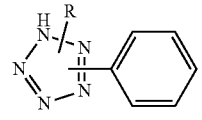
pentazolylpyridine (I-F7)

-continued

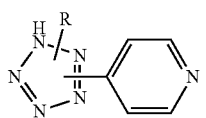

pyridine adducts of
pentazole derivatives
(I-F8)

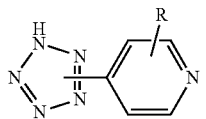

pentazole adducts of
pyridine derivatives
(I-F9)

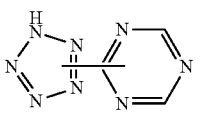

pentazolyltriazine
(I-F10)

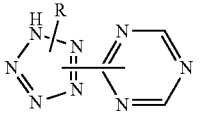

triazine adducts of
pentazole derivatives
(I-F11)

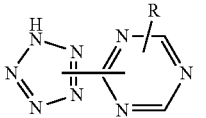

pentazole adducts of
triazine derivatives
(I-F12)

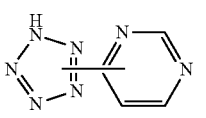

pentazolylpyrimidine
(I-F13)

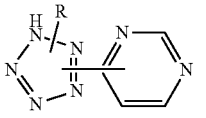

pyrimidine adducts of
pentazole derivatives
(I-F14)

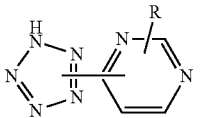

pentazole adducts of
pyrimidine derivatives
(I-F15)

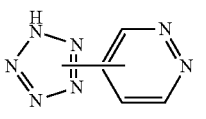

pentazolylpyridazine
(I-F16)

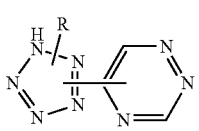

pyridazine adducts of
pentazole derivatives
(I-F17)

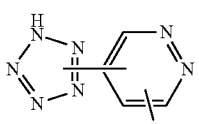

pentazole adducts of
pyridazine derivatives
(I-F18)

furan
(I-G)

furan derivatives
(I-G1)

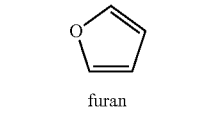

phenylfuran
(I-G2)

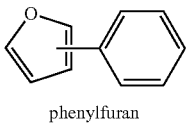

furan adducts of
benzene derivatives
(I-G3)

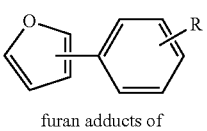

benzene adducts of
furan derivatives
(I-G4)

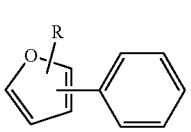

furanylpyridine
(I-G5)

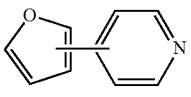

pyridine adducts of
furan derivatives
(I-G6)

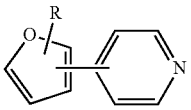

-continued

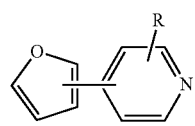 (I-G7)

furan adducts of
pyridine derivatives

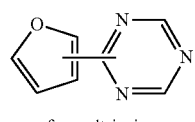 (I-G8)

furanyltriazine

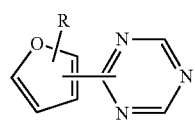 (I-G9)

triazine adducts of
furan derivatives

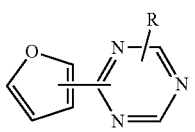 (I-G10)

furan adducts of
triazine derivatives

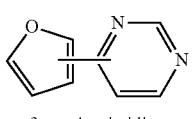 (I-G11)

furanylpyrimidine

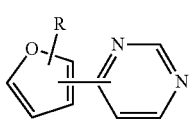 (I-G12)

pyrimidine adducts of
furan derivatives

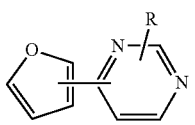 (I-G13)

furan adducts of
pyrimidine derivatives

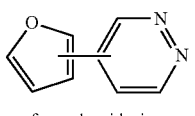 (I-G14)

furanylpyridazine

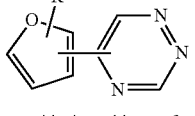 (I-G15)

pyridazine adducts of
furan derivatives

-continued

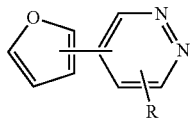 (I-G16)

furan adducts of
pyridazine derivatives

 (I-H)

thiophene

 (I-H1)

thiophene derivatives

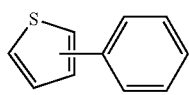 (I-H2)

phenylthiophene

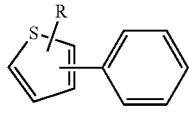 (I-H4)

thiophene adducts of
benzene derivatives

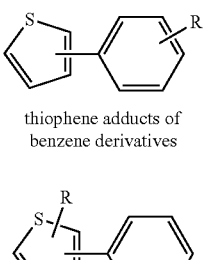 (I-H5)

benzene adducts of
thiophene derivatives

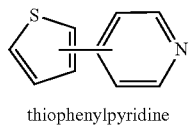 (I-H6)

thiophenylpyridine

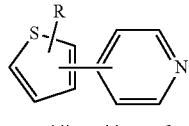 (I-H7)

pyridine adducts of
thiophene derivatives

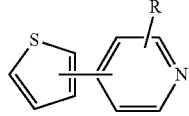 (I-H8)

thiophene adducts of
pyridine derivatives

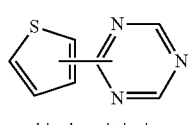 (I-H9)

thiophenyltriazine

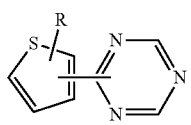

triazine adducts of
thiophene derivatives
(I-H10)

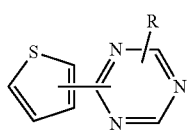

thiophene adducts of
triazine derivatives
(I-H11)

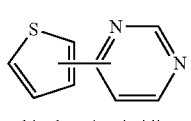

thiophenylpyrimidine
(I-H12)

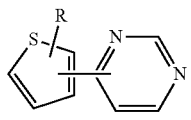

pyrimidine adducts of
thiophene derivatives
(I-H13)

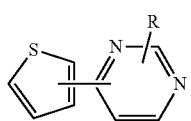

thiophene adducts of
pyrimidine derivatives
(I-H14)

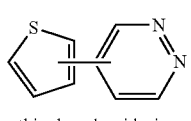

thiophenylpyridazine
(I-H15)

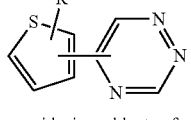

pyridazine adducts of
thiophene derivatives
(I-H16)

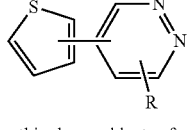

thiophene adducts of
pyridazine derivatives
(I-H17)

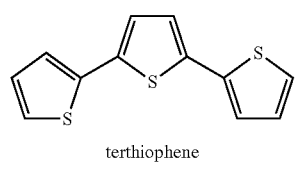

terthiophene
(I-H18)

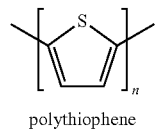

polythiophene
(I-H19)

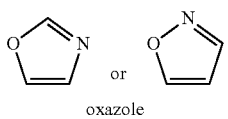

oxazole
(I-1)

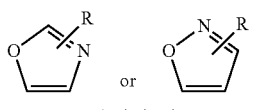

oxazole derivatives
(I-I1)

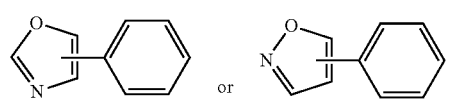

phenyloxazole
(I-I2)

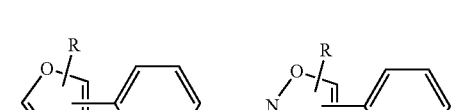

oxazole adducts of benzene derivatives
(I-I3)

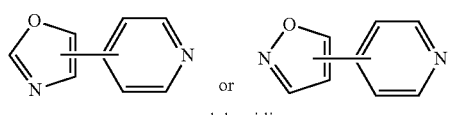

benzene adducts of oxazole derivatives
(I-I4)

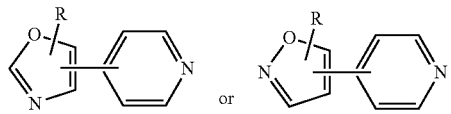

oxazolylpyridine
(I-I5)

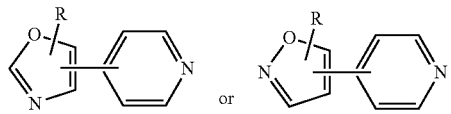

pyridine adducts of oxazole derivatives
(I-I6)

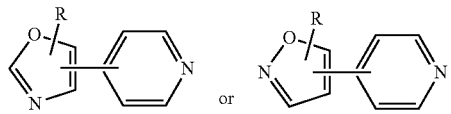

pyridine adducts of oxazole derivatives
(I-I7)

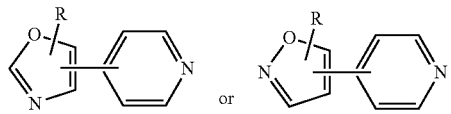

oxazole adducts of pyridine derivatives
(I-I8)

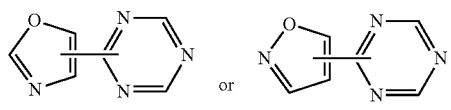

oxazolyltriazine
(I-I9)

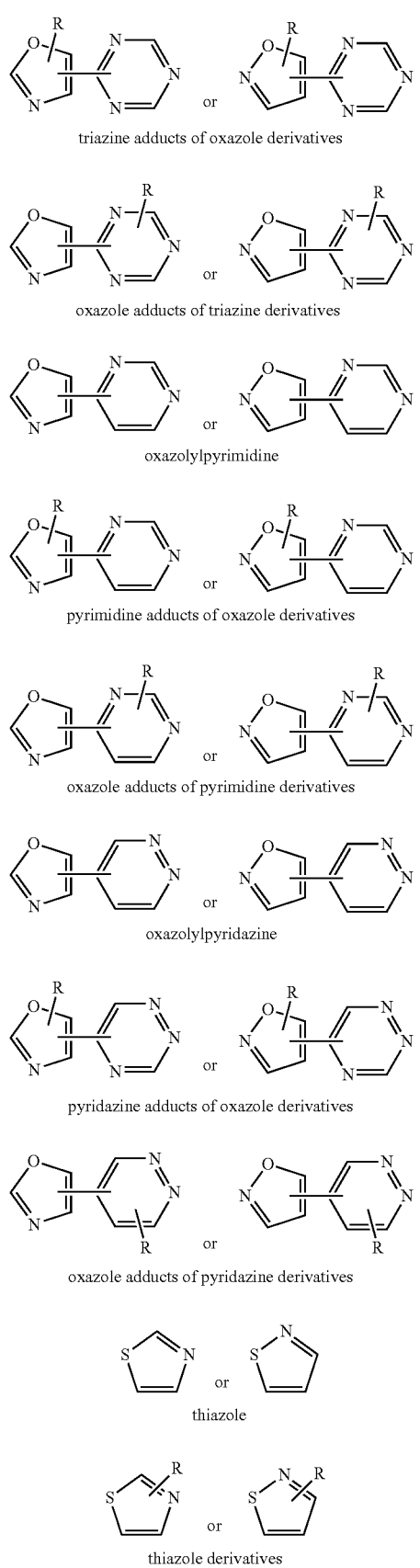

(I-I10) triazine adducts of oxazole derivatives (I-I11) oxazole adducts of triazine derivatives (I-I12) oxazolylpyrimidine (I-I13) pyrimidine adducts of oxazole derivatives (I-I14) oxazole adducts of pyrimidine derivatives (I-I15) oxazolylpyridazine (I-I16) pyridazine adducts of oxazole derivatives (I-I17) oxazole adducts of pyridazine derivatives (I-J) thiazole (I-J1) thiazole derivatives (I-J2) phenylthiazole (I-J3) thiazole adducts of benzene derivatives (I-J4) benzene adducts of thiazole derivatives (I-J5) thiazolylpyridine (I-J6) pyridine adducts of thiazole derivatives (I-J7) thiazole adducts of pyridine derivatives (I-J8) thiazolyltriazine (I-J9) triazine adducts of thiazole derivatives (I-J10) thiazole adducts of triazine derivatives (I-J11) thiazolylpyrimidine (I-J12)

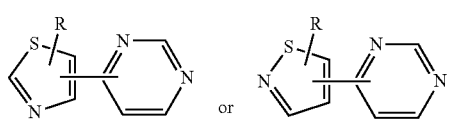

pyrimidine adducts of thiazole derivatives (I-J13)

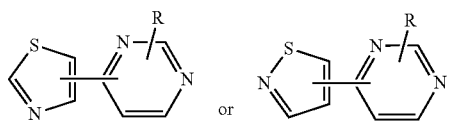

thiazole adducts of pyrimidine derivatives (I-J14)

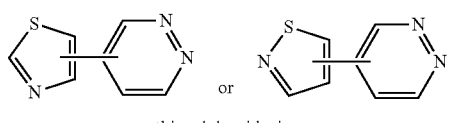

thiazolylpyridazine (I-J15)

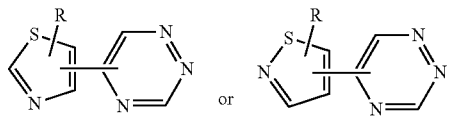

pyridazine adducts of thiazole derivatives (I-J16)

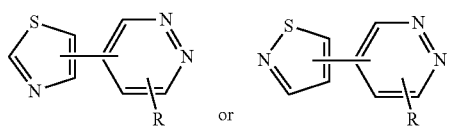

thiazole adducts of pyridazine derivatives (I-K)

oxadiazole (I-K1)

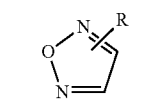

oxadiazole derivatives (I-K2)

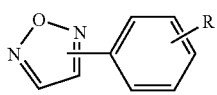

oxadiazole adducts of benzene derivatives (I-K3)

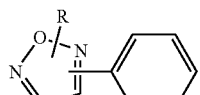

benzene adducts of oxadiazole derivatives (I-K4)

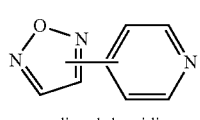

oxadiazolylpyridine (I-K5)

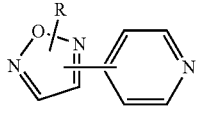

pyridine adducts of oxadiazole derivatives (I-K6)

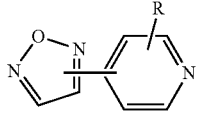

oxadiazole adducts of pyridine derivatives (I-K7)

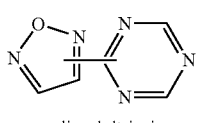

oxadiazolyltriazine (I-K8)

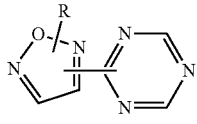

triazine adducts of oxadiazole derivatives (I-K9)

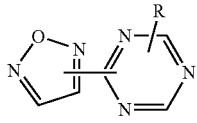

oxadiazole adducts of triazine derivatives (I-K10)

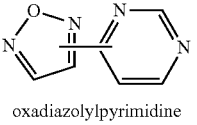

oxadiazolylpyrimidine (I-K11)

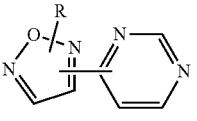

pyrimidine adducts of oxadiazole derivatives (I-K12)

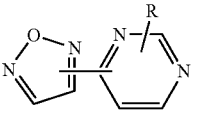

oxadiazole adducts of pyrimidine derivatives (I-K13)

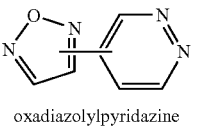

oxadiazolylpyridazine

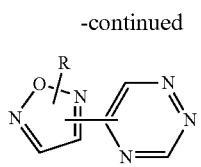

pyridazine adducts of
oxadiazole derivatives (I-K14)

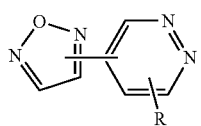

oxadiazole adducts of
pyridazine derivatives (I-K15)

Referring to the cyclic compounds of Formula (5), the constituting element $b_1$, $b_2$, $b_3$, $b_4$, $b_5$, and $b_6$ stands for at least one of carbon, nitrogen, oxygen, sulfur, and phosphorus atoms. Usually, these elements provide the respective constituting elements by themselves, but they may be applied in combination of two or more. These six constituting elements include a chemical bond between neighboring constituting elements regardless of the type of bond. Otherwise, the same as the abovementioned $a_1$, $a_2$, $a_3$, $a_4$, and $a_5$ will hold true.

The cyclic compounds of Formula (5), too, show aromaticity under conditions under which they are used, as is the case with the aforesaid compounds of Formula (4). As is again the case with the aforesaid compound of Formula (4), the conditions for this compound to show aromaticity would appear to include, in addition to the fact that it possesses aromaticity in itself, ionization or radicalization of the elements (atoms) $b_1$, $b_2$, $b_3$, $b_4$, $b_5$ and $b_6$, changes in the type of bond of the elements $b_1$, $b_2$, $b_3$, $b_4$, $b_5$ and $b_6$, detachment of atoms or functional groups attached to the elements $b_1$, $b_2$, $b_3$, $b_4$, $b_5$ and $b_6$, changes in the type of bond of atoms or functional groups attached to the elements $b_1$, $b_2$, $b_3$, $b_4$, $b_5$ and $b_6$, ionization or radicalization of atoms attached to elements at the 1 to 6 positions, oxidization or reduction of functional groups attached to the elements $b_1$, $b_2$, $b_3$, $b_4$, $b_5$ and $b_6$, extraneous light irradiation, electromagnetic wave irradiation, application of voltages, etc, and so on. Note here that the type of, and the process of development of, aromaticity does not matter.

The cyclic compounds represented by Formula (5) include pyridine, pyridinium salts, pyridine derivatives, pyridazine, pyridazine derivatives, pyrimidine, pyrimidine derivatives, pyrazine, pyrazine derivatives, triazine, triazine derivatives, tetrazine, tetrazine derivatives, pyran, pyran derivatives, dioxin, dioxin derivatives, thiopyran, thiopyran derivatives, dithiin, dithiin derivatives, oxathiin, oxathiin derivatives, benzene derivatives, aniline, aniline derivatives, benzoic acid, benzoic acid derivatives, phthalic acid, phthalic acid derivatives, phenol, phenol derivatives, polyvalent phenol, polyvalent phenol derivatives, flavan, flavonoid, vanilloid, etc. There is the specific mention of pyridine, pyridazine, pyrimidine, pyrazine, 1,2,3-triazine, 1,2-4-triazine, 1,3,5-triazine, 1,2,3,4-tetrazine, 1,2,4,5-tetrazine, 1,2,3,5-tetrazine, 2H-pyran, 1,4-dioxin, 1,2-dioxin, 4H-1,3-dioxin, 2H-thiopyran, 1,4-dithiin, 1,2-dithiin, 4H-1, 3-dithiin, 1,2-oxathiin, 1,4-oxathiin, 4H-1,3-oxathiin, benzoic acid, nicotinic acid, isonicotinic acid, pyridine-3-amine, pyridine-4-amine, pyridin-3-ol, pyridin-4-ol, 3-phenylpyridine, 4-phenylpyridine, pyridine fluoride, pyridazine-pyridazine-4-carboxylic acid, pyridazine-3-carboxylic acid, pyridazine-4-amine, pyridazine-3-amine, pyridazin-4-ol, pyridazin-3-ol, 3-phenylpyridazine, 4-phenylpyridazine, pyrimidine-4-carboxylic acid, pyrimidine-5-carboxylic acid, pyrimidine-4-amine, pyrimidine-5-amine, pyrimidin-4-ol, pyrimidin-5-ol, 4-phenylpyrimidine, 5-phenylpyrimidine, pyrazine-2-carboxylic acid, pyrazine-2,6-dicarboxylic acid, pyrazine-2-amine, pyrazine-2,6-diamine, pyrazin-2-ol, pyrazine-2,6-diol, 2-phenylpyrazine, triazine-4-carboxylic acid, triazine-5-carboxylic acid, triazine-5-amine, triazine-4-amine, triazin-5-ol, triazin-4-ol, 5-phenyltriazine, 4-phenyltriazine, 1,2,4-triazine-3-carboxylic acid, 1,2,4-triazine-6-carboxylic acid, 1,2,4-triazine-5-carboxylic acid, 1,2,4-triazine-3-amine, 1,2,4-triazine-6-amine, 1,2,4-triazine-5-amine, 1,2,4-triazin-3-ol, 1,2,4-triazin-6-ol, 1,2,4-triazin-5-ol, 3-phenyl-1,2,4-triazine, 6-phenyl-1,2,4-triazine, 5-phenyl-1,2,4-triazine, 1,3,5-triazine-2-carboxylic acid, 1,3,5-triazine-2,4-dicarboxylic acid, 1,3,5-triazine-2,4,6-triacetic acid, 1,3,5-triazine-2-amine, 1,3,5-triazine-2,4-diamine, 1,3,5-triazin-2-ol, 1,3,5-triazine-2,4-diol, 2-phenyl-1,3,5-triazine, 2,4-diphenyl-1,3,5-triazine, 2,4,6-triphenyl-1, 3,5-triazine, tetrazine-5-amine, tetrazine-5,6-diamine, tetrazin-5-ol, 5-phenyltetrazine, 5,6-diphenyltetrazine, 1,2, 4,5-tetrazine-3-carboxylic acid, 1,2,4,5-tetrazine-3,6-dicarboxylic acid, 1,2,4,5-tetrazine-3-amine, 1,2,4,5-tetrazine-3, 6-diamine, 1,2,4,5-tetrazin-3-ol, 1,2,4,5-tetrazine-3,6-diol, 3-phenyl-1,2,4,5-tetrazine, 3,6-diphenyl-1,2,4,5-tetrazine, 1,2,3,5-tetrazine-4-carboxylic acid, 1,2,3,5-tetrazine-4,6-dicarboxylic acid, 1,2,3,5-tetrazine-4-amine, 1,2,3,5-tetrazine-4,6-diamine, 1,2,3,5-tetrazin-4-ol, 1,2,3,5-tetrazine-4,6-diol, 4-phenyl-1,2,3,5-tetrazine, 4,6-diphenyl-1,2,3,5-tetrazine, 2H-pyran-2-carboxylic acid, 2H-pyran-3-carboxylic acid, 2H-pyran-4-carboxylic acid, 2H-pyran-2,6-dicarboxylic acid, 2H-pyran-3,5-dicarboxylic acid, 2H-pyran-2-amine, 2H-pyran-3-amine, 2H-pyran-4-amine, 2H-pyran-2,6-diamine, 2H-pyran-3,5-diamine, 2H-pyran-2-ol, 2H-pyran-3-ol, 2H-pyran-4-ol, 2H-pyran-2,6-diol, 2H-pyran-3,5-diol, 2-phenyl-2H-pyran, 3-phenyl-2H-pyran, 4-phenyl-2H-pyran, 2,6-diphenyl-2H-pyran, 3,5-diphenyl-2H-pyran, 1,4-dioxin-2-carboxylic acid, 1,4-dioxin-2,3-dicarboxylic acid, 1,4-dioxin-2,6-dicarboxylic acid, 1,4-dioxin-2-amine, 1,4-dioxin-2,3-diamine, 1,4-dioxin-2,6-diamine, 1,4-dioxin-2-ol, 1,4-dioxin-2,3-diol, 1,4-dioxin-2,6-diol, 2-phenyl-1,4-dioxin, 2,3-diphenyl-1,4-dioxin, dioxin-3-carboxylic acid, dioxin-4-carboxylic acid, dioxin-3-ol, 4H-1,3-dioxin-5-amine, 4H-1,3-dioxin-5-ol, 4-phenyl-4H-1,3-dioxin, 2H-thiopyran-3-carboxylic acid, 2H-thiopyran-4-carboxylic acid, 2H-thiopyran-6-amine, 2H-thiopyran-5,6-diamine, 2H-thiopyran-4-amine, 2H-thiopyran-6-ol, 2H-thiopyran-3-ol, 2H-thiopyran-4-ol, 2H-thiopyran-4-thiol, 3-phenyl-2H-thiopyran, 2,6-diphenyl-2H-thiopyran, 1,4-dithiin-2-carboxylic acid, 1,4-dithiin-2,3-dicarboxylic acid, 2,6-diphenyl-1, 4-dithiin, 2,5-diphenyl-1,4-dithiin, dithiin-4-carboxylic acid, dithiin-3,4-dicarboxylic acid, dithiin-3,6-diamine, dithiin-4,5-diol, 3,6-diphenyldithiin, 2-vinyl-4H-1,3-dithiin, oxathiin-3-carboxylic acid, oxathiin-3,4-diamine, 6-phenyloxathiin, 3,4-diphenyloxathiin, 1,4-oxathiin-2-carboxylic acid, 2-methyl-1,4-oxathiin, 3-methyl-1,4-oxathiin, 2-phenyl-1,4-oxathiin, 3-phenyl-1,4-oxathiin, 2,3-diphenyl-1,4-oxathiin, flavone, catechin, vanillin, vanillic acid, ferulic acid, ethylvanillin, 2,3-dihydroxybenzoic acid, 2,4-dihydroxyzenzoic acid, 2,5-dihydroxyzenoic acid, 2,6-dihydroxybenzoic acid, 3,4-dihydroxybenzoic acid, 3,5-dihydroxybenzoic acid, phthalic acid, isophthalic acid, terephthalic acid, benzene-1,3,5-triacetic acid, benzene-1,2, 4-triacetic acid, benzene-1,2,3-triacetic acid, benzaldehyde, nitrobenzene, methyl-2-hydroxybenzoic acid, 2-hydroxybenzoic acid, phenyl acetate, 4-aminobenzentiol, benzenesulfonic acid, 4-(4-aminophenyl)disulfanylaniline, phenylacetamide, acetylsalicylic acid, picric acid, aniline, benzene-1,2-diamine, benzene-1,4-diamine, benzene-1,3-diamine, benzene-1,3,5-triamine, benzene-1,2,4-triamine, benzene-1,2,3-triamine, phenol, benzene-1,2-diol, benzene-1,4-diol, benzene-1,3-diol, benzene-1,3,5-triol, benzene-1,2,4-triol, benzene-1,2,3-triol, 2-aminophenol, 4-aminophenol, 3-aminophenol, phenylalanine, tyrosine, etc.

By way of example but not by way of limitation, typical specific structures of the above-exemplified cyclic compounds represented by formula (5) are given below.

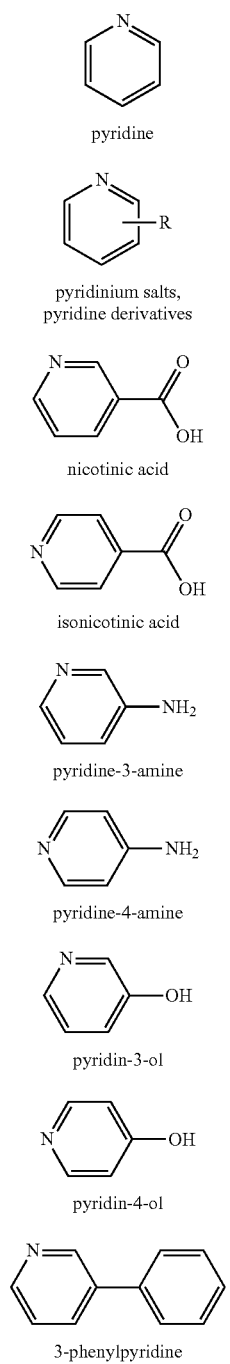

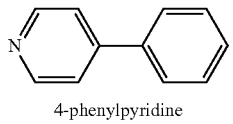

4-phenylpyridine (II-A9)

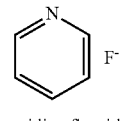

pyridine fluoride (II-A10)

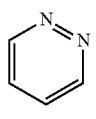

pyridazine (II-B)

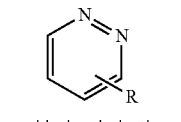

pyridazine derivatives (II-B1)

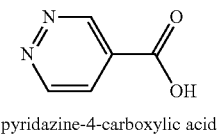

pyridazine-4-carboxylic acid (II-B2)

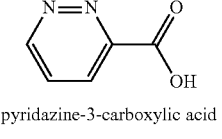

pyridazine-3-carboxylic acid (II-B3)

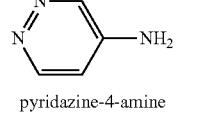

pyridazine-4-amine (II-B4)

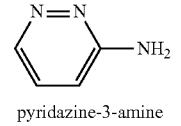

pyridazine-3-amine (II-B5)

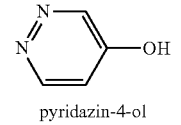

pyridazin-4-ol (II-B6)

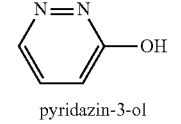

pyridazin-3-ol (II-B7)

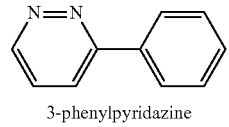

3-phenylpyridazine (II-B8)

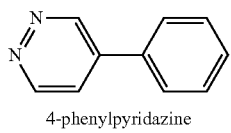

4-phenylpyridazine (II-B9)

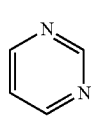

pyrimidine (II-C)

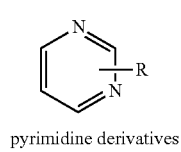

pyrimidine derivatives (II-C1)

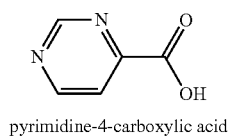

pyrimidine-4-carboxylic acid (II-C2)

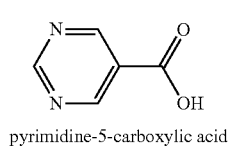

pyrimidine-5-carboxylic acid (II-C3)

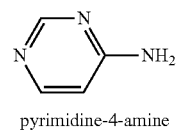

pyrimidine-4-amine (II-C4)

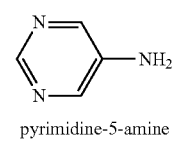

pyrimidine-5-amine (II-C5)

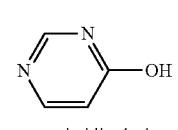

pyrimidin-4-ol (II-C6)

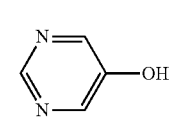

pyrimidin-5-ol (II-C7)

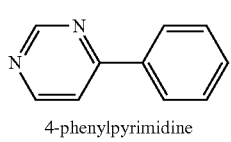

4-phenylpyrimidine (II-C8)

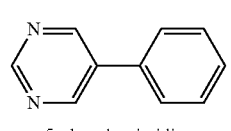

5-phenylpyrimidine (II-C9)

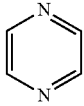

pyrazine (II-D)

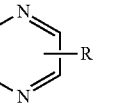

pyrazine derivatives (II-D1)

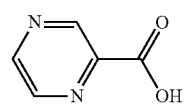

pyrazine-2-carboxylic acid (II-D2)

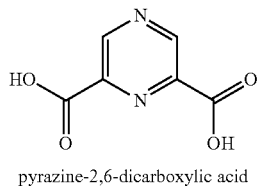

pyrazine-2,6-dicarboxylic acid (II-D3)

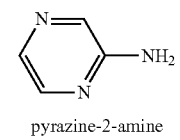

pyrazine-2-amine (II-D4)

pyrazine-2,6-diamine (II-D5)

pyrazin-2-ol (II-D6)

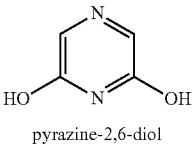

pyrazine-2,6-diol (II-D7)

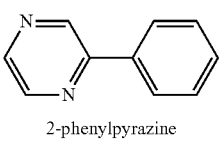

2-phenylpyrazine (II-D8)

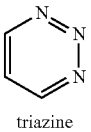

triazine (II-E)

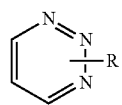 (II-E1)

1,2,3-triazine derivatives

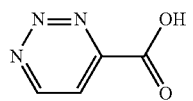 (II-E2)

triazine-4-carboxylic acid

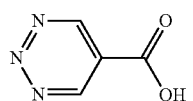 (II-E3)

triazine-5-carboxylic acid

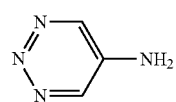 (II-E4)

triazine-5-amine

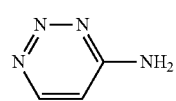 (II-E5)

triazine-4-amine

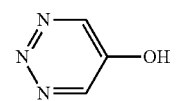 (II-E6)

triazin-5-ol

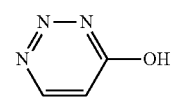 (II-E7)

triazin-4-ol

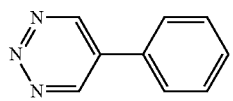 (II-E8)

5-phenyltriazine

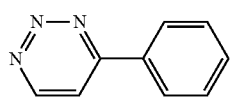 (II-E9)

4-phenyltriazine

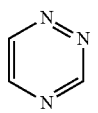 (II-E10)

1,2,4-triazine

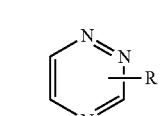 (II-E11)

1,2,4-triazine derivatives

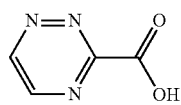 (II-E12)

1,2,4-triazine-3-carboxylic acid

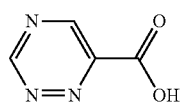 (II-E13)

1,2,4-triazine-6-carboxylic acid

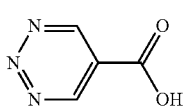 (II-E14)

1,2,4-triazine-5-carboxylic acid

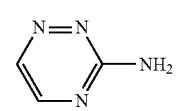 (II-E15)

1,2,4-triazine-3-amine

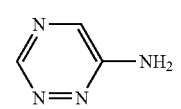 (II-E16)

1,2,4-triazine-6-amine

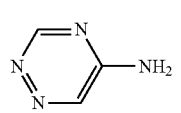 (II-E-17)

1,2,4-triazine-5-amine

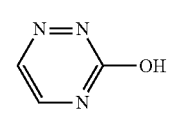 (II-E18)

1,2,4-triazin-3-ol

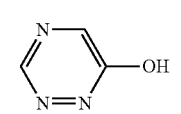 (II-E19)

1,2,4-triazin-6-ol

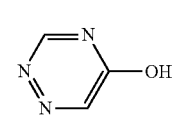 (II-E20)

1,2,4-triazin-5-ol

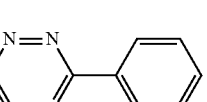 (II-E21)

3-phenyl-1,2,4-triazine

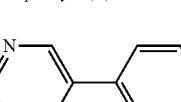 (II-E22)

6-phenyl-1,2,4-triazine

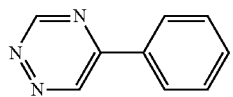

5-phenyl-1,2,4-triazine (II-E23)

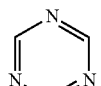

1,3,5-triazine (II-E30)

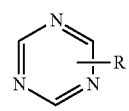

1,3,5-triazine derivatives (II-E31)

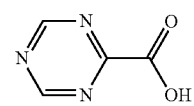

1,3,5-triazine-2-carboxylic acid (II-E32)

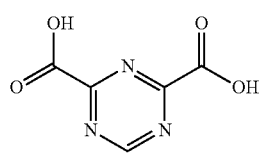

1,3,5-triazine-2,4-dicarboxylic acid (II-E33)

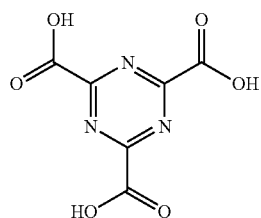

1,3,5-triazine-2,4,6-triacetic acid (II-E34)

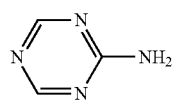

1,3,5-triazine-2-amine (II-E35)

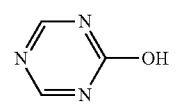

1,3,5-triazin-2-ol (II-E37)

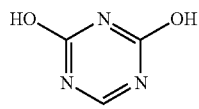

1,3,5-triazine-2,4-diol (II-E38)

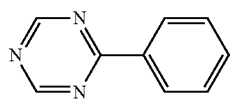

2-phenyl-1,3,5-triazine (II-E39)

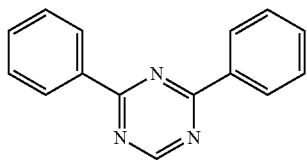

2,4-diphenyl-1,3,5-triazine (II-E40)

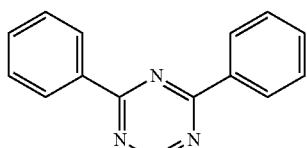

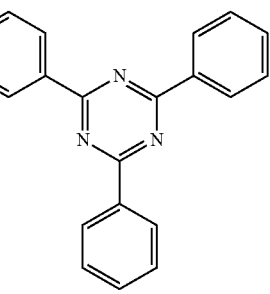

2,4,6-triphenyl-1,3,5-triazine (II-E41)

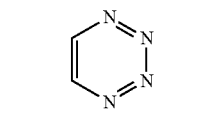

tetrazine, 1,2,3,4-tetrazine (II-F)

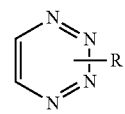

1,2,3,4-tetrazine derivatives (II-F1)

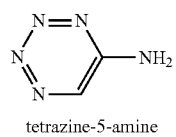

tetrazine-5-amine (II-F2)

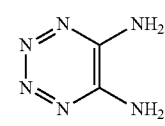

tetrazine-5,6-diamine (II-F3)

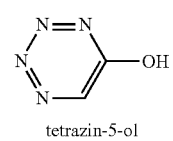

tetrazin-5-ol (II-F4)

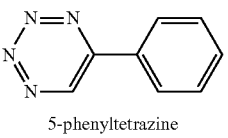

5-phenyltetrazine (II-F5)

-continued

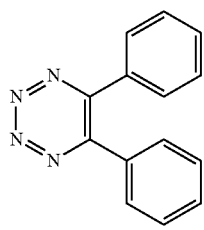
5,6-diphenyltetrazine (II-F6)

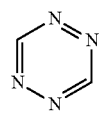
1,2,4,5-tetrazine (II-F10)

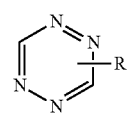
1,2,4,5-tetrazine derivatives (II-F11)

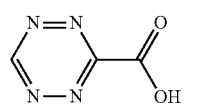
1,2,4,5-tetrazine-3-carboxylic acid (II-F12)

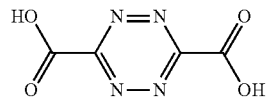
1,2,4,5-tetrazine-3,6-dicarboxylic acid (II-F13)

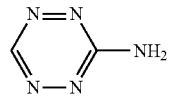
1,2,4,5-tetrazine-3-amine (II-F14)

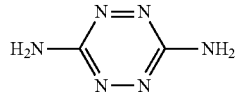
1,2,4,5-tetrazine-3,6-diamine (II-F15)

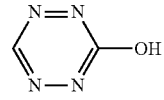
1,2,4,5-tetrazin-3-ol (II-F16)

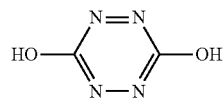
1,2,4,5-tetrazin-3,6-ol (II-F17)

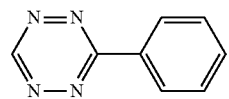
3-phenyl-1,2,4,5-tetrazine (II-F18)

-continued

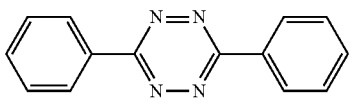
3,6-diphenyl-1,2,4,5-tetrazine (II-F19)

1,2,3,5-tetrazine (II-F20)

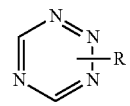
1,2,3,5-tetrazine derivatives (II-F21)

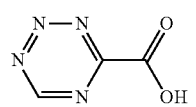
1,2,3,5-tetrazine-4-carboxylic acid (II-F22)

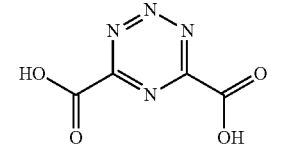
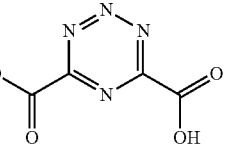
1,2,3,5-tetrazine-4,6-dicarboxylic acid (II-F23)

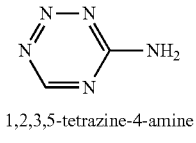
1,2,3,5-tetrazine-4-amine (II-F24)

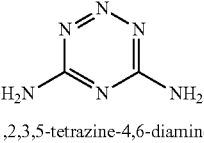
1,2,3,5-tetrazine-4,6-diamine (II-F25)

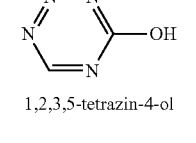
1,2,3,5-tetrazin-4-ol (II-F26)

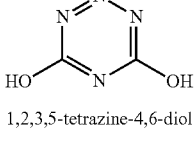
1,2,3,5-tetrazine-4,6-diol (II-F27)

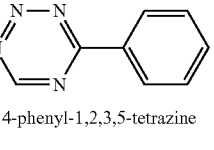
4-phenyl-1,2,3,5-tetrazine (II-F28)

(II-F29)

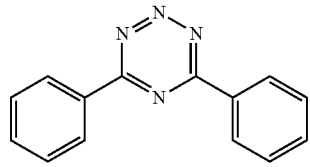

4,6-diphenyl-1,2,3,5-tetrazine (II-G)

pyran, 2H-pyran (II-G1)

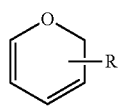

2H-pyran derivatives (II-G2)

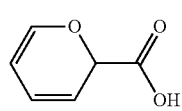

2H-pyran-2-carboxylic acid (II-G3)

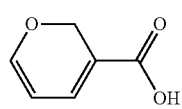

2H-pyran-3-carboxylic acid (II-G4)

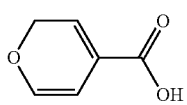

2H-pyran-4-carboxylic acid (II-G5)

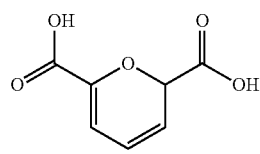

2H-pyran-2,6-dicarboxylic acid (II-G6)

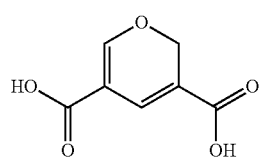

2H-pyran-3,5-dicarboxylic acid (II-G7)

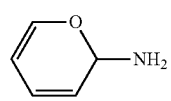

2H-pyran-2-amine (II-G8)

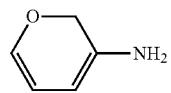

2H-pyran-3-amine (II-G9)

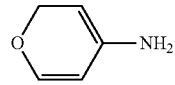

2H-pyran-4-amine (II-G10)

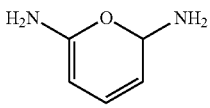

2H-pyran-2,6-diamine (II-G11)

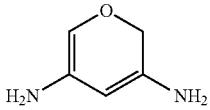

2H-pyran-3,5-diamine (II-G12)

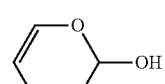

2H-pyran-2-ol (II-G13)

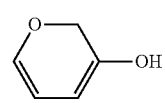

2H-pyran-3-ol (II-G14)

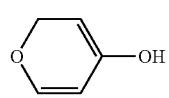

2H-pyran-4-ol (II-G15)

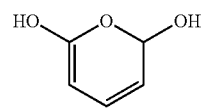

2H-pyran-2,6-diol (II-G16)

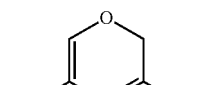

2H-pyran-3,5-diol (II-G17)

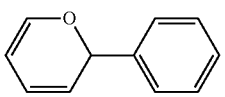

2-phenyl-2H-pyran (II-G18)

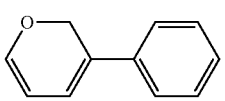

3-phenyl-2H-pyran (II-G19)

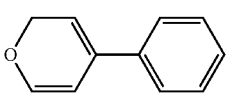

4-phenyl-2H-pyran

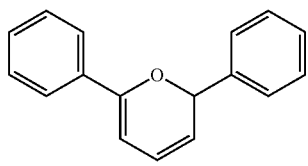
2,6-diphenyl-2H-pyran (II-G20)
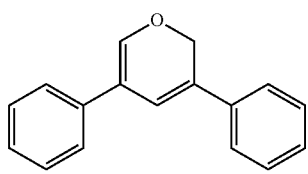
3,5-diphenyl-2H-pyran (II-G21)
dioxin, 1,4-dioxin (II-H)
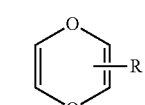
1,4-dioxin derivatives (II-H1)
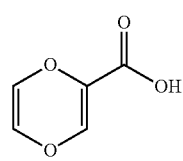
1,4-dioxin-2-carboxylic acid (II-H2)
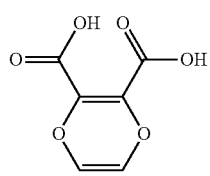
1,4-dioxin-2,3-dicarboxylic acid (II-H3)
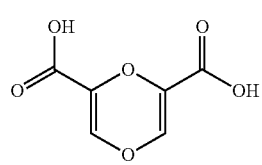
1,4-dioxin-2,6-dicarboxylic acid (II-H4)
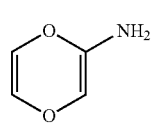
1,4-dioxin-2-amine (II-H5)
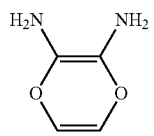
1,4-dioxin-2,3-diamine (II-H6)
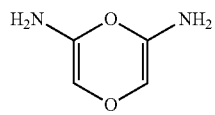
1,4-dioxin-2,6-diamine (II-H7)
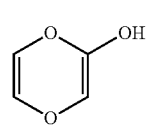
1,4-dioxin-2-ol (II-H8)
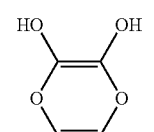
1,4-dioxin-2,3-diol (II-H9)
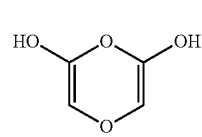
1,4-dioxin-2,6-ol (II-H10)
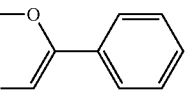
2-phenyl-1,4-dioxin (II-H11)
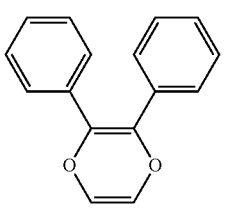
2,3-diphyenl-1,4-dioxin (II-H12)
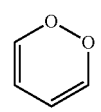
1,2-dioxin (II-H20)
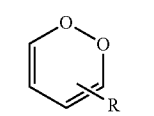
1,2-dioxin derivatives (II-H21)

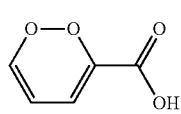

dioxin-3-carboxylic acid (II-H22)

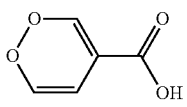

dioxin-4-carboxylic acid (II-H23)

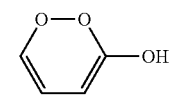

dioxin-3-ol (II-H24)

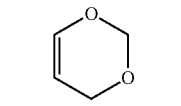

4H-1,3-dioxin (II-H30)

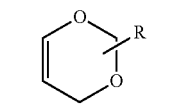

4H-1,3-dioxin derivatives (II-H31)

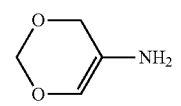

4H-1,3-dioxin-5-amine (II-H32)

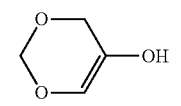

4H-1,3-dioxin-5-ol (II-H33)

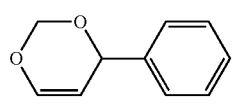

4-phenyl-4H-1,3-dioxin (II-H34)

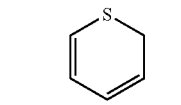

thiopyran, 2H-thipyran (II-I)

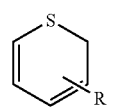

2H-thiopyran derivatives (II-I1)

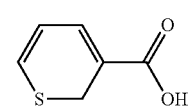

2H-thiopyran-3-carboxylic acid (II-I2)

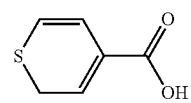

2H-thiopyran-4-carboxylic acid (II-I3)

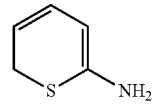

2H-thiopyran-6-amine (II-I4)

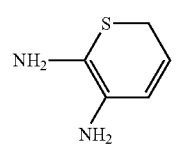

2H-thiopyran-5,6-diamine (II-I5)

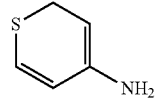

2H-thiopyran-4-amine (II-I6)

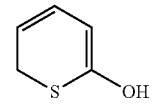

2H-thiopyran-6-ol (II-I7)

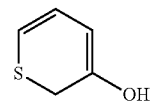

2H-thiopyran-3-ol (II-I8)

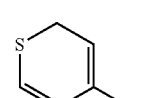

2H-thiopyran-4-ol (II-I9)

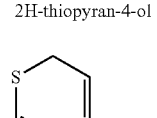

2H-thiopyran-4-thiol (II-I10)

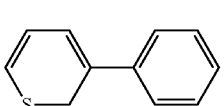

3-phenyl-2H-thiopyran (II-I11)

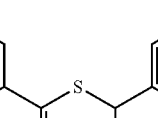

2,6-diphenyl-2H-thiopyran (II-I12)

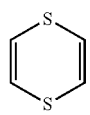

dithiin, 1,4-dithiin (II-J)

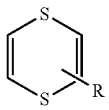

1,4-dithiin derivatives (II-J1)

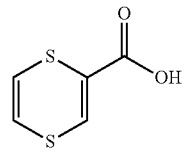

1,4-dithiin-2-carboxylic acid (II-J2)

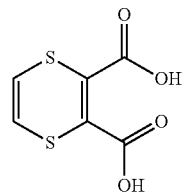

1,4-dithiin-2,3-dicarboxylic acid (II-J3)

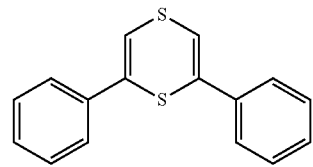

2,6-diphenyl-1,4-dithiin (II-J4)

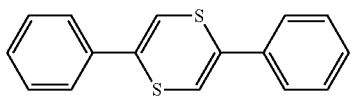

2,5-diphenyl-1,4-dithiin (II-J5)

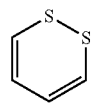

1,2-dithiin (II-J10)

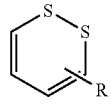

1,2-dithiin derivatives (II-J11)

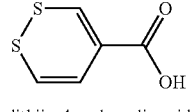

dithiin-4-carboxylic acid (II-J12)

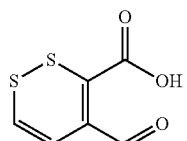

dithiin-3,4-dicarboxylic acid (II-J13)

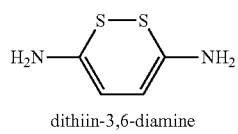

dithiin-3,6-diamine (II-J14)

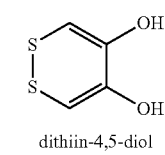

dithiin-4,5-diol (II-J15)

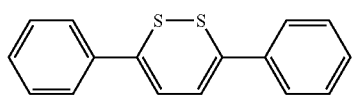

3,6-diphenyldithiin (II-J16)

4H-1,3-dithiin (II-J20)

4H-1,3-dithiin derivatives (II-J21)

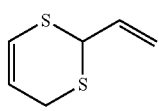

2-vinyl-4H-1,3-dithiin (II-J22)

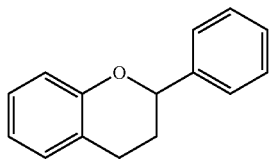

flavonoid, flavan (II-K)

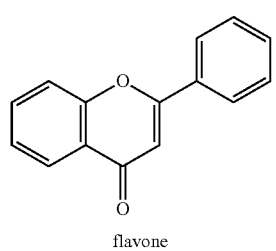

flavone (II-K1)

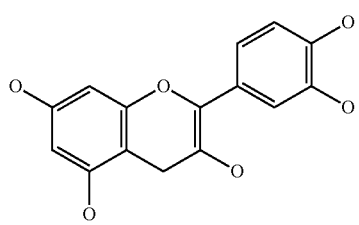
catechin (II-K2)
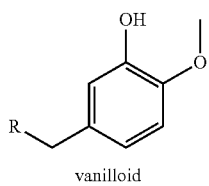
vanilloid (II-L)
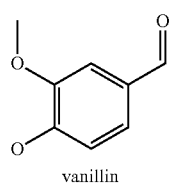
vanillin (II-L1)
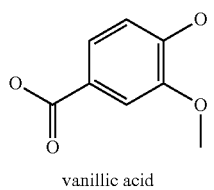
vanillic acid (II-L2)
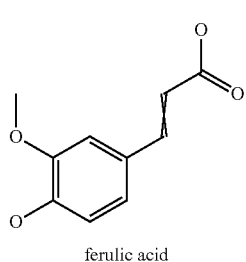
ferulic acid (II-L3)
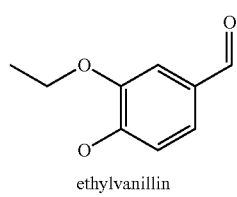
ethylvanillin (II-L4)
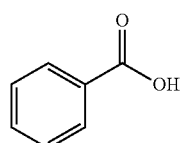
benzoic acid (II-M)
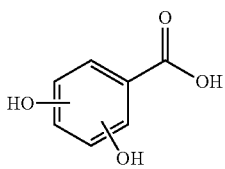
benzoic acid derivatives (II-M1)
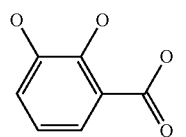
2,3-dihydroxybenzoic acid (II-M2)
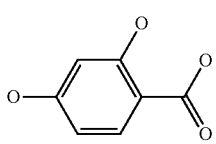
2,4-dihydroxybenzoic acid (II-M3)
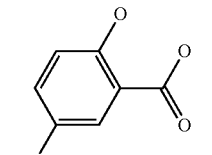
2,5-dihydroxybenzoic acid (II-M4)
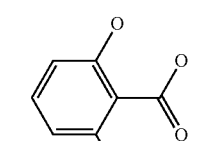
2,6-dihydroxybenzoic acid (II-M5)
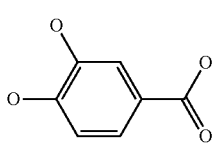
3,4-dihydroxybenzoic acid (II-M6)
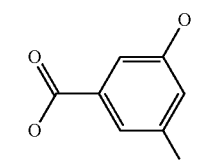
3,5-dihydroxybenzoic acid (II-M7)

-continued

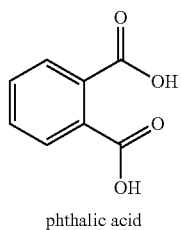
phthalic acid (II-M10)

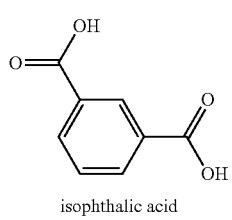
isophthalic acid (II-M11)

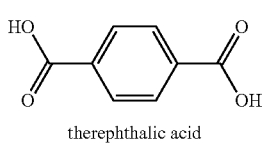
therephthalic acid (II-M12)

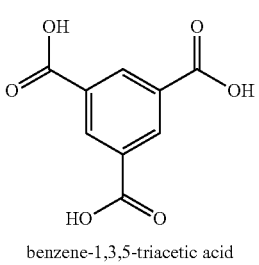
benzene-1,3,5-triacetic acid (II-M13)

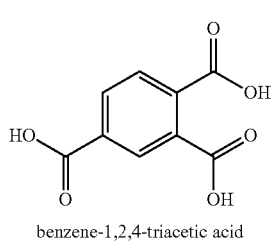
benzene-1,2,4-triacetic acid (II-M14)

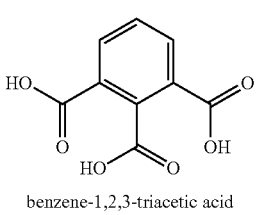
benzene-1,2,3-triacetic acid (II-M15)

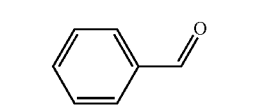
benzene derivatives, benzaldehyde (II-M16)

nitrobenzene (II-M17)

-continued

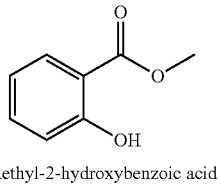
methyl-2-hydroxybenzoic acid (II-M18)

2-hydroxybenzoic acid (II-M19)

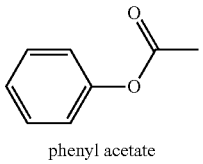
phenyl acetate (II-M20)

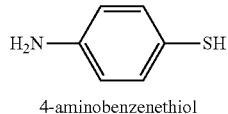
4-aminobenzenethiol (II-M21)

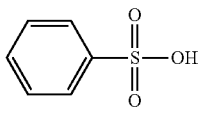
benzensulfonic acid (II-M22)

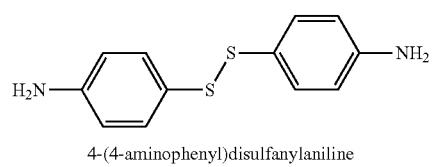
4-(4-aminophenyl)disulfanylaniline (II-M23)

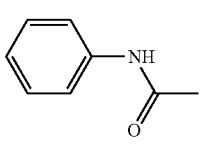
phenylacetamide (II-M24)

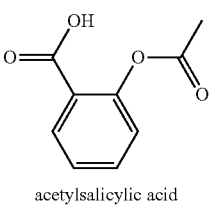
acetylsalicylic acid (II-M25)

(II-M26)

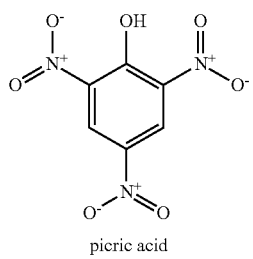

picric acid (II-N1)

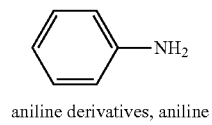

aniline derivatives, aniline (II-N2)

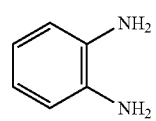

benzene-1,2-diamine (II-N3)

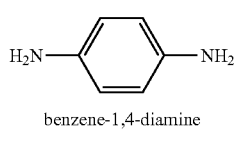

benzene-1,4-diamine (II-N4)

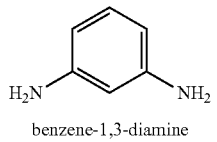

benzene-1,3-diamine (II-N5)

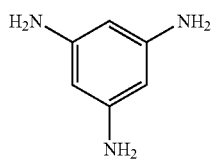

benzene-1,3,5-triamine (II-N6)

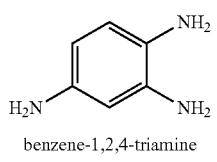

benzene-1,2,4-triamine (II-N7)

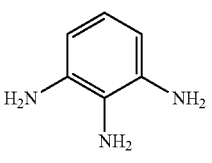

benzene-1,2,3-triamine (II-O1)

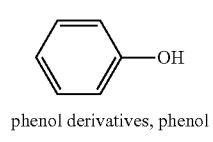

phenol derivatives, phenol (II-O2)

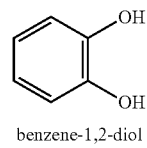

benzene-1,2-diol (II-O3)

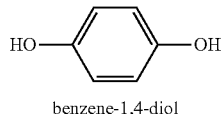

benzene-1,4-diol (II-O4)

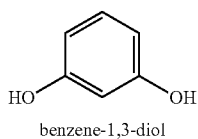

benzene-1,3-diol (II-O5)

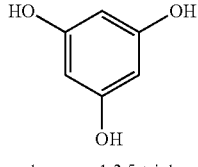

benzene-1,3,5-triol (II-O6)

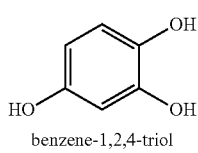

benzene-1,2,4-triol (II-O7)

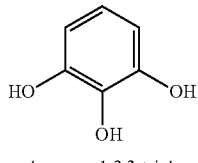

benzene-1,2,3-triol (II-O8)

2-aminophenol (II-O9)

4-aminophenol (II-O10)

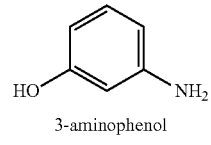

3-aminophenol (II-O11)

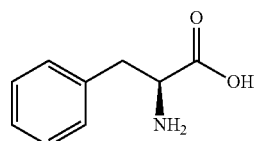

phenylalanine

-continued

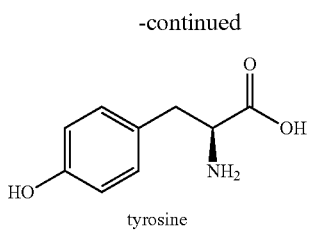

tyrosine
(II-O12)

Referring to the cyclic compounds of Formula (6), the constituting elements (elements) $c_1$, $c_2$, $c_3$, $c_4$, $c_5$, $c_6$, $c_7$, $c_8$, and $c_9$ stands for at least one of carbon, nitrogen, oxygen, sulfur and phosphorus atoms, and these elements may provide the respective constituting elements alone or in combination of two or more. The constituting elements $c_1$, $c_2$ and $c_3$ as well as the constituting elements $c_5$, $c_6$, $c_7$ and $c_8$ include a chemical bond between neighboring elements, and there is a chemical bond between the constituting elements $c_4$ and $c_9$ that may be regarded as neighboring elements. Note here that the types of these chemical bonds do not matter. And these nine constituting elements form together a cyclic structure wherein a 5-membered ring and a 6-membered ring are linked together. Otherwise, the constituting elements are the same as mentioned regarding the aforesaid Formula (4) as well as $a_1$, $a_2$, $a_3$, $a_4$ and $a_5$.

The cyclic compound of Formula (6), too, shows aromaticity under conditions under which it is used, as is the case with the aforesaid compound of Formula (4). The conditions under which this compound shows aromaticity would appear to include, in addition to the aromaticity that this compound has in itself, ionization or radicalization of the elements (atoms) $c_1$, $c_2$, $c_3$, $c_4$, $c_5$, $c_6$, $c_7$, $c_8$, and $c_9$, changes in the types of bonds of the elements $c_1$, $c_2$, $c_3$, $c_4$, $c_5$, $c_6$, $c_7$, $c_8$, and $c_9$, detachment of atoms or functional groups attached to the elements $c_1$, $c_2$, $c_3$, $c_4$, $c_5$, $c_6$, $c_7$, $c_8$, and $c_9$, changes in the types of bonds of atoms or functional groups attached to the elements $c_1$, $c_2$, $c_3$, $c_4$, $c_5$, $c_6$, $c_7$, $c_8$, and $c_9$, ionization or radicalization of atoms attached to the elements $c_1$, $c_2$, $c_3$, $c_4$, $c_5$, $c_6$, $c_7$, $c_8$, and $c_9$, ionization or radicalization of functional groups attached to the elements $c_1$, $c_2$, $c_3$, $c_4$, $c_5$, $c_6$, $c_7$, $c_8$, and $c_9$, chemical changes such as oxidization or reduction of functional groups attached to the elements $c_1$, $c_2$, $c_3$, $c_4$, $c_5$, $c_6$, $c_7$, $c_8$, and $c_9$, application of extraneous light, electromagnetic waves, and voltages, etc. as is the case with the aforesaid compound of Formula (4). Note here that the type of, and the process of development of, aromaticity does not matter.

The cyclic compounds represented by Formula (6) include benzofuran, benzofuran derivatives, dihydrobenzofuran, dihydrobenzofuran derivatives, tetrahydrobenzofuran, tetrahydrobenzofuran derivatives, indole, indole derivatives, dihydroindole, dihydroindole derivatives, tetrahydroindole, tetrahydroindole derivatives, benzothiophene, benzothiophene derivatives, dihydrobenzothiophene, dihydrobenzothiophene derivatives, tetrahydrobenzothiophene, tetrahydrobenzothiophene derivatives, indolizine, indolizine derivatives, benzimidazole, benzimidazole derivatives, indazole, indazole derivatives, benzodioxole, benzodioxole derivatives, benzodithiol, benzodithiol derivatives, benzoxazole, benzoxazole derivatives, dihydrobenzoxazole, dihydrobenzoxazole derivatives, benzothiazole, benzothiazole derivatives, dihydrobenzothiazole, dihydrobenzothiazole derivatives, benzoxathiole, benzoxathiole derivatives, dihydrobenzoxathiole, dihydrobenzoxathiole derivatives, benzotriazole, benzotriazole derivatives, dihydrobenzotriazole, dihydrobenzotriazole derivatives, tetrahydrobenzotriazole, tetrahydrobenzotriazole derivatives, benzoxadiazole, benzoxadiazole derivatives, dihydrobenzoxadiazole, dihydrobenzoxadiazole derivatives, tetrahydrobenzoxadiazole, tetrahydrobenzoxadiazole derivatives, benzothiadiazole, benzothiadiazole derivatives, dihydrobenzothiadiazole, dihydrobenzothiadiazole derivatives, tetrahydrobenzothiadiazole, tetrahydrobenzothiadiazole derivatives, purine, purine derivatives, phthalic acid imide, phthalic acid imide derivatives, phthalic anhydride, phthalic anhydride derivatives, etc. There is the specific mention of 1-benzofuran, 2-benzofuran, 2,3-dihydro-1-benzofuran, 1,3-dihydro-2-benzofuran, 2,3,3a,7a-tetrahydro-1-benzofuran, 1,3,3a,7a-tetrahydro-2-benzofuran, 1H-indole, 2H-isoindole, tryptophan, 2,3-dihydro-1H-indole, 2,3-dihydro-1H-isoindole, 2,3,3a,7a-tetrahydro-1H-indole, 2,3,3a,7a-tetrahydro-1H-isoindole, 1-benzothiophene, 2-benzothiophene, 2,3-dihydro-1-benzothiophene, 1,3-dihydro-2-benzothiophene, 2,3,3a,7a-tetrahydro-1-benzothiophene, 1,3,3a,7a-tetrahydro-2-benzothiophene, indolizine, 1H-benzimidazole, 1H-indazole, 1,3-benzodioxol, 3H-1,2-benzodioxol, 1,3-benzodithiol, 3H-1,2-benzodithiol, 1,3-benzoxazole, 1,2-benzoxazole, 2,1-benzoxazole, 2,3-dihydro-1,3-benzoxazole, 2,3-dihydro-1,2-benzoxazole, 1,3-dihydro-2,1-benzoxazole, 1,3-benzothiazole, 1,2-benzothiazole, 2,1-benzothiazole, 2,3-dihydro-1,3-benzothiazole, 2,3-dihydro-1,2-benzothiazole, 1,3-dihydro-2,1-benzothiazole, 1,3-benzoxathiol, 3H-2,1-benzoxathiol, 3H-1,2-benzoxathiol, 3a,7a-dihydro-1,3-benzoxathiol, 3a,7a-dihydro-3H-2,1-benzoxathiol, 3a,7a-dihydro-3H-1,2-benzoxathiol, 1H-benzotriazole, 1-hydroxybenzotriazole, 3a,7a-dihydro-1H-benzotriazole, 2,3,3a,7a-tetrahydro-1H-benzotriazole, 2,1,3-benzoxadiazole, 1,2,3-benzoxadiazole, 1,3-dihydro-2,1,3-benzoxadiazole, 3a,7a-dihydro-1,2,3-benzoxadiazole, 1,3,3a,7a-tetrahydro-2,1,3-benzoxadiazole, 2,3,3a,7a-tetrahydro-1,2,3-benzoxadiazole, 2,1,3-benzothiadiazole, 1,2,3-benzothiadiazole, 1,3-dihydro-2,1,3-benzothiadiazole, 3a,7a-dihydro-1,2,3-benzothiadiazole, 1,3,3a,7a-tetrahydro-2,1,3-benzothiadiazole, 2,3,3a,7a-tetrahydro-1,2,3-benzothiadiazole, 9H-purine, adenine, guanine, hypoxanthine, xanthine, theobromine, caffeine, uric acid, isoguanine, phthalic acid imide, phthalic anhydride, etc.

By way of example but not by way of limitation, typical specific structures of the above-exemplified cyclic compounds represented by Formula (6) are given below.

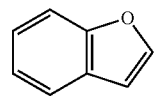

1-benzofuran
(III-A1a)

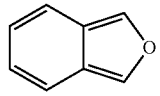

2-benzofuran
(III-A1b)

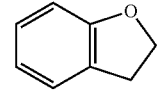

2,3-dihydro-1-benzofuran
(III-A2a)

-continued

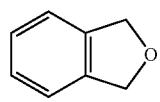
1,3-dihydro-2-benzofuran (III-A2b)

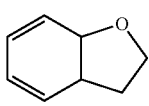
2,3,3a,7a-tetrahydro-1-benzofuran (III-A3a)

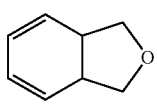
1,3,3a,7a-tetrahydro-2-benzofuran (III-A3b)

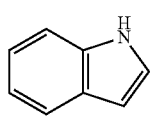
1H-indole (III-B1a)

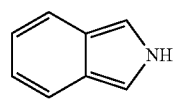
2H-isoindole (III-B1b)

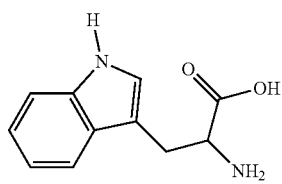
tryptophan (III-B1c)

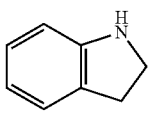
2,3-dihydro-1H-indole (III-B2a)

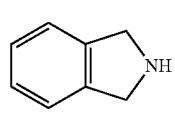
2,3-dihydro-1H-isoindole (III-B2b)

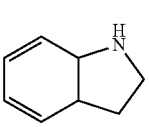
2,3,3a,7a-tetrahydro-1H-indole (III-B3a)

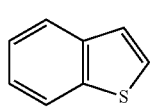
1-benzothiophene (III-C1a)

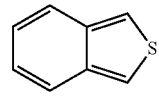
2-benzothiophene (III-C1b)

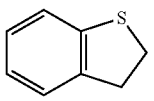
2,3-dihydro-1-benzothiophene (III-C2a)

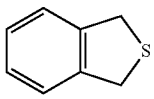
2,3-dihydro-1-benzothiophene (III-C2b)

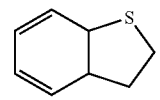
2,3,3a,7a-tetrahydro-1-benzothiophene (III-C3a)

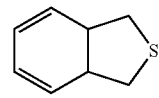
1,3,3a,7a-tetrahydro-2-benzothiophene (III-C3b)

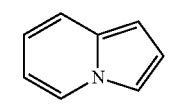
indolizine (III-D)

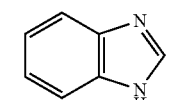
1H-benzimidazole (III-E)

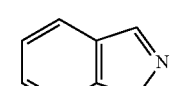
1H-indazole (III-F)

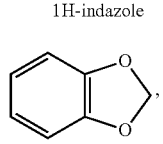
1,3-benzodioxole (III-G1a)

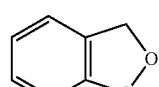
1,2-benzodioxole (III-G1b)

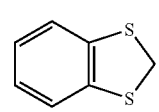
1,3-benzodithiole (III-H1a)

-continued

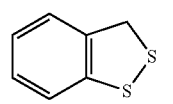
3H-1,2-benzodithiole (III-H1b)

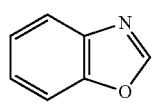
1,3-benzoxazole (III-I1a)

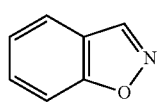
1,2-benzoxazole (III-I1b)

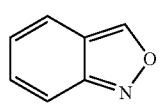
2,1-benzoxazole (III-I1c)

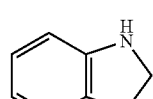
2,3-dihydro-1,3-benzoxazole (III-I2a)

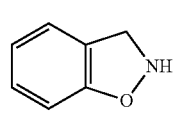
2,3-dihydro-1,2-benzoxazole (III-I2b)

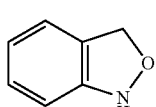
1,3-dihydro-2,1-benzoxazol (III-I2c)

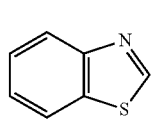
1,3-benzothiazole (III-J1a)

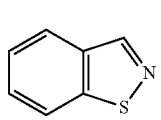
1,2-benzothiazole (III-J1b)

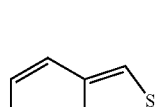
2,1-benzothiazole (III-J1c)

-continued

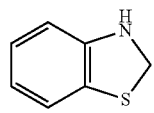
2,3-dihydro-1,3-benzothiazole (III-J2a)

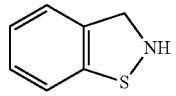
2,3-dihydro-1,2-benzothiazole (III-J2b)

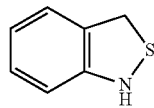
1,3-dihydro-2,1-benzothiazole (III-J2c)

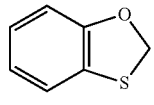
1,3-benzoxathiole (III-K1a)

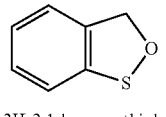
3H-2,1-benzoxathiole (III-K1b)

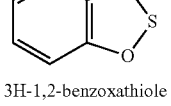
3H-1,2-benzoxathiole (III-K1c)

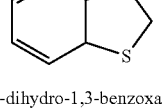
3a,7a-dihydro-1,3-benzoxathiole (III-K2a)

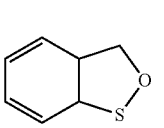
3a,7a-dihydro-3H-2,1-benzoxathiole (III-K2b)

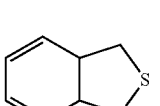
3a,7a-dihydro-3H-1,2-benzoxathiol (III-K2c)

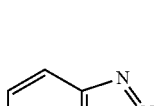
1H-benzotriazole (III-L1a)

-continued

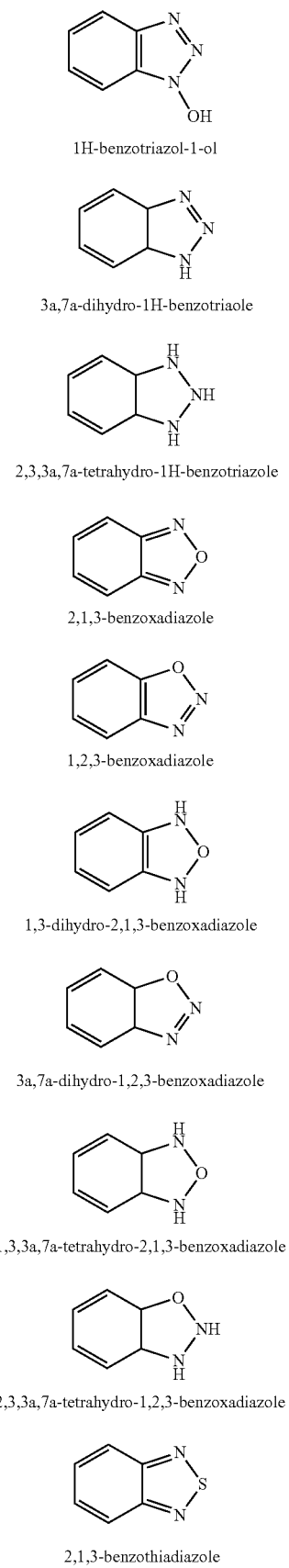

1H-benzotriazol-1-ol (III-L1b)

3a,7a-dihydro-1H-benzotriaole (III-L2)

2,3,3a,7a-tetrahydro-1H-benzotriazole (III-L3)

2,1,3-benzoxadiazole (III-M1a)

1,2,3-benzoxadiazole (III-M1b)

1,3-dihydro-2,1,3-benzoxadiazole (III-M2a)

3a,7a-dihydro-1,2,3-benzoxadiazole (III-M2b)

1,3,3a,7a-tetrahydro-2,1,3-benzoxadiazole (III-M3a)

2,3,3a,7a-tetrahydro-1,2,3-benzoxadiazole (III-M3b)

2,1,3-benzothiadiazole (III-N1a)

-continued

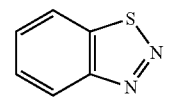

1,2,3-benzothiadiazole (III-N1b)

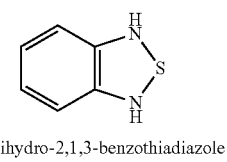

1,3-dihydro-2,1,3-benzothiadiazole (III-N2a)

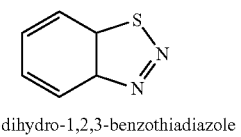

3a,7a-dihydro-1,2,3-benzothiadiazole (III-N2b)

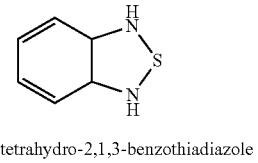

1,3,3a,7a-tetrahydro-2,1,3-benzothiadiazole (III-N3a)

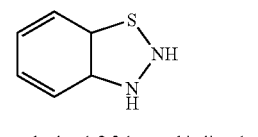

2,3,3a,7a-tetrahydro-1,2,3-benzothiadiazole (III-N3b)

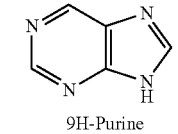

9H-Purine (III-O)

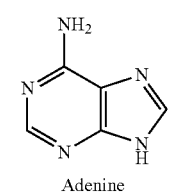

Adenine (III-O1)

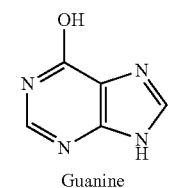

Guanine (III-O2)

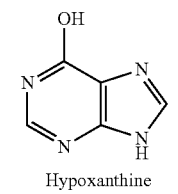

Hypoxanthine (III-O3)

(III-O4)
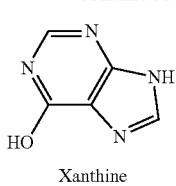
Xanthine (III-O5)
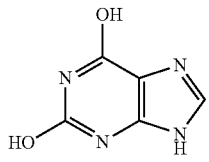
Theobromine (III-O6)
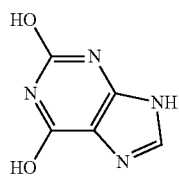
Caffeine (III-O7)
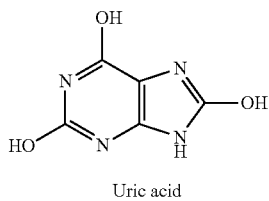
Uric acid (III-O8)
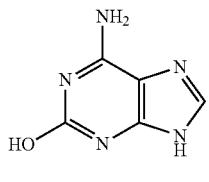
soguanine (III-P1)
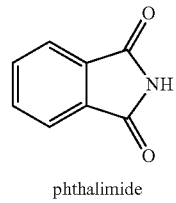
phthalimide (III-P2)
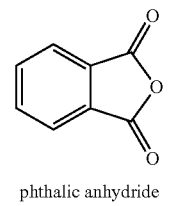
phthalic anhydride Referring to the cyclic compounds of formula (7), the constituting elements (atoms) $d_1$, $d_2$, $d_3$, $d_4$, $d_5$, $d_6$, $d_7$, and $d_8$ stands for at least one of carbon, nitrogen, oxygen, sulfur and phosphorus atoms, and usually these elements provide the respective constituting elements, although they may be used in combination of two or more. The constituting elements $d_1$, $d_2$, $d_3$, $d_4$, $d_5$, $d_6$, $d_7$, and $d_8$ include a chemical bond between neighboring constituting elements, and there are chemical bonds between three neighboring constituting elements provided that the constituting elements $d_3$ and $d_7$ are regarded as neighboring elements. Note here that the types of these chemical bonds do not matter. These eight constituting elements form together a cyclic structure in a form in which a 5-membered ring is linked to a 5-membered ring. Otherwise, the same as applied to the aforesaid formula (4) and $a_1$, $a_2$, $a_3$, $a_4$ and $a_5$ will hold true.

The cyclic compound of formula (6), too, takes on aromaticity under conditions under which it is used, as is the case with the aforesaid compounds of formula (4). The conditions for this compound to take on aromaticity would appear to include, in addition to the fact that this compound possesses aromaticity in itself, ionization or radicalization of the elements (atoms) $d_1$, $d_2$, $d_3$, $d_4$, $d_5$, $d_6$, $d_7$, and $d_8$, changes in the types of bonds of the elements $d_1$, $d_2$, $d_3$, $d_4$, $d_5$, $d_6$, $d_7$, and $d_8$, detachment of atoms or functional groups attached to the elements at the 1 to 8 positions, changes in the types of bonds of atoms or functional groups attached to the elements $d_1$, $d_2$, $d_3$, $d_4$, $d_5$, $d_6$, $d_7$, and $d_8$, ionization or radicalization of atoms attached to the elements $d_1$, $d_2$, $d_3$, $d_4$, $d_5$, $d_6$, $d_7$, and $d_8$, ionization or radicalization of functional groups attached to the elements $d_1$, $d_2$, $d_3$, $d_4$, $d_5$, $d_6$, $d_7$, and $d_8$, chemical changes such as oxidization or reduction of functional groups attached to the elements ionization or radicalization of atoms attached to the elements $d_1$, $d_2$, $d_3$, $d_4$, $d_5$, $d_6$, $d_7$, and $d_8$, extraneous light irradiation, electromagnetic wave irradiation, application of voltages, etc, as is the case with the aforesaid compounds of formula (4). Note here that the type of, and the process of development of, aromaticity does not matter.

The cyclic compounds represented by formula (7) include dihydropyrrolo-pyrrole, dihydropyrrolo-pyrrole derivatives, tetrahydropyrrolo-pyrrole, tetrahydropyrrolo-pyrrole derivatives, furopyrrole, furopyrrole derivatives, dihydrocyclopentapyrrole, dihydrocyclopentapyrrole derivatives, tetrahydrocyclopentapyrrole, tetrahydrocyclopentapyrrole derivatives, dihydrothienopyrrole, dihydrothienopyrrole derivatives, furoimidazole, furoimidazole derivatives, imidazooxazole, imidazooxazole derivatives, dihydroimidazoimidazole, dihydroimidazoimidazole derivatives, furofuran, furofuran derivatives, dihydrofuran, dihydrofuran derivatives, thienofuran, thienofuran derivatives, thienopyrrole, thienopyrrole derivatives, thienoimidazole, thienoimidazole derivatives, thienothiophene, thienothiophene derivatives, dihydrothienothiophene, dihydrothienothiophene derivatives, dihydropyrrolo-pyrazole, dihydropyrrolo-pyrazole derivatives, dihydropyrazolo-pyrazole, dihydropyrazolo-pyrazole derivatives, cyclopentathiophene, cyclopentathiophene derivatives, cyclopentafuran, cyclopentafuran derivatives, furooxazole, furooxazole derivatives, thienothiazole, thienothiazole derivatives, oxazolooxazole, oxazolooxazole derivatives, thiazolothiazole, thiazolothiazole derivatives, and so on. There is the specific mention of 2-furo[3,2-b]pyrrol-4-yl acetamide, 3-methyl-4H-furo[3,2-b]pyrrole, 6-iodo-5-methyl-4H-furo[3,2-b]pyrrole, N-ethylfuro[3,2-b]pyrrole-4-amine, N-methyl-1H-pyrrolo[3,2-b]pyrrole-4-amine, N-propan-2-yl-1H-pyrrolo[3,2-b]pyrrole-4-amine, [1,2]oxazolo[3,4-d][1,2]oxazole, [1,2]thiazolo[3,4-d][1,2]thiazole, 1,2,3,4-tetrahydropyrrolo[3,2-b]pyrrole, 1,2,3,5-tetrahydropyrrolo[3,4-c]pyrrole, 1,2-dihydropyrrolo[3,4-c]pyrazole, 1,4,5,6-tetrahydrocyclopenta[b]pyrrole, 1,4,5,6-tetrahydropyrrolo[3,4-b]pyrrole, 1,4-dihydrocyclopenta[b]pyrrole, 1,4-dihydropyrazolo[4,3-c]pyrazole-6-amine, 1,4-dihydropyrazolo[4,3-c]pyrazole, 1,4-dihydropyrrolo[3,2-b]

pyrrole-5-amine, 1,4-dihydropyrrolo[3,2-b]pyrrole, 1,4-dimethylpyrrolo[3,2-b]pyrrole-6-amine, 1,4-dimethylpyrrolo[3,2-b]pyrrole, 1,5-dihydropyrrolo[3,4-b]pyrrole, 1,5-dimethyl-4H-pyrrolo[3,2-b]pyrrole, 1,6-dihydrocyclopenta[b]pyrrole, 1,6-dihydroimidazo[4,5-d]imidazole, 1,6-dihydropyrrolo[3,4-b]pyrrole, 1-furo[3,2-b]pyrrol-4-ylethanone, 1H-furo[2,3-d]imidazole-2-amine, 1H-furo[2,3-d]imidazol-2-yl ethanol, 1H-furo[2,3-d]imidazole-5-amine, 1H-furo[2,3-d]imidazol-5-ol, 1H-furo[2,3-d]imidazole, 1H-furo[2,3-d]imidazole-2,5-diamine, 1H-furo[3,4-b]pyrrole, 1H-furo[3,4-d]imidazole, 1H-pyrrolo[3,2-b]pyrrole-4-amine, 1H-pyrrolo[3,2-b]pyrrole-4,6-diamine, 1H-pyrrolo[3,2-b]pyrrole-4-carboxylic acid, 1H-thieno[2,3-d]imidazole-2-amine, 1H-thieno[2,3-d]imidazole-5-amine, 1H-thieno[2,3-d]imidazole, 1H-thieno[3,4-b]pyrrole, 1H-thieno[3,4-d]imidazole, 1-hydroxy-4H-pyrrolo[3,2-b]pyrrole-6-amine, 1-hydroxythieno[2,3-d]imidazole, 1-methylfuro[2,3-d]imidazole-2-amine, 1-methylfuro[2,3-d]imidazole-5-amine, 1-methylfuro[2,3-d]imidazole, 1-methylthieno[2,3-d]imidazole-2-amine, 1-methylthieno[2,3-d]imidazole, 1-vinylthieno[2,3-d]imidazole, 2-(1H-furo[2,3-d]imidazol-2-yl)ethanol, 2-(2-methylpropyl)-4H-furo[3,2-b]pyrrole, 2-(2-morpholin-4-ylethyl)-4H-furo[3,2-b]pyrrole, 2-(4H-furo[3,2-b]pyrrol-2-yl)ethanol, 2-(4H-furo[3,2-b]pyrrol-2-yl)-N,N-dimethylethylamine, 2-(4H-thieno[3,2-b]pyrrol-6-yl)ethylamine, 2-(oxolan-2-yl methyl)-4H-furo[3,2-b]pyrrole, 2,3-dihydrofuro[3,2-b]furan, 2,3-dihydrothieno[3,2-b]thiophene, 2,5-bis(methylsulfanyl)thieno[3,2-b]thiophene, 2,6-dihydropyrrolo[3,4-c]pyrrole, 2-[(5-amino-1H-furo[2,3-d]imidazol-2-yl)amino]ethanol, 2-butyl-4H-furo[3,2-b]pyrrole, 2-chloro-4H-thieno[3,2-b]pyrrole, 2-ethoxy-1H-furo[2,3-d]imidazole, 2-ethoxy-4H-furo[3,2-b]pyrrole, 2-heptyl-4H-furo[3,2-b]pyrrole, 2-methoxy-1H-furo[2,3-d]imidazole, 2-methoxy-1H-thieno[2,3-d]imidazole, 2-methoxy-1-methylfuro[2,3-d]imidazole, 2-methoxy-4H-furo[3,2-b]pyrrole, 2-methyl-1H-furo[2,3-d]imidazole, 2-methyl-1H-thieno[2,3-d]imidazole, 2-methyl-4H-furo[3,2-b]pyrrole, 2-methyl-4H-thieno[3,2-b]pyrrole, 2-methylthieno[3,2-b]furan, 2-N-ethyl-1H-furo[2,3-d]imidazole-2,5-diamine, 2-N-methyl-1H-furo[2,3-d]imidazole-2,5-diamine, 2-N-methyl-1H-thieno[2,3-d]imidazole-2,5-diamine, 2-propyl-4H-furo[3,2-b]pyrrole, 3,4-dihydro-2H-thieno[3,2-b]pyrrole, 3,4-dimethylfuro[3,2-b]pyrrole, 3,6-dimethyl-4H-furo[3,2-b]pyrrole, 3-bromo-4H-thieno[3,2-b]pyrrole, 3H-thieno[2,3-d]imidazole-4-oxide, 3-hydroxyfuro[2,3-d]imidazole, 3-methyl-1,4-dihydrocyclopenta[b]pyrrole, 3-methyl-4H-cyclopenta-[b]furan, 3-methyl-4H-thieno[3,2-b]pyrrole, 3-methyl-4-methylidenecyclopenta[b]furan, 3-methylfuro[2,3-d]imidazole, 3-methylthieno[2,3-d]imidazole, 3-methylthieno[3,2-b]furan, 4,5,6-trimethyl-1H-pyrrolo[3,2-b]pyrrole, 4,5-dimethyl-1H-imidazo[4,5-d]imidazole, 4,6-dihydro-1H-thieno[3,4-b]pyrrole, 4-ethoxy-1H-pyrrolo[3,2-b]pyrrole, 4H-cyclopenta[b]furan, 4H-furo[3,2-b]pyrrole-2-amine, 4H-furo[3,2-b]pyrrol-2-ol, 4H-furo[3,2-b]pyrrol-6-ol, 4H-furo[3,2-b]pyrrole, 4H-imidazo[4,5-d][1,3]oxazole, 4H-pyrrolo[3,2-b]pyrrole-1,6-diamine, 4H-thieno[3,2-b]pyrrole-2-amine, 4H-thieno[3,2-b]pyrrole, 4H-thieno[3,2-b]pyrrole-1-oxide, 4-hydroxy-1H-pyrrolo[3,2-b]pyrrole-6-amine, 4-hydroxy-1H-pyrrolo[3,2-b]pyrrole, 4-hydroxyfuro[3,2-b]pyrrole-3-amine, 4-methoxy-1H-pyrrolo[3,2-b]pyrrole, 4-methoxyfuro[3,2-b]pyrrole-3-amine, 4-methyl-1H-pyrrolo[3,2-b]pyrrole-6-amine, 4-methylfuro[3,2-b]pyrrole, 4-methylthieno[3,2-b]pyrrole, 4-N,4-N-diethylfuro[3,2-b]pyrrole-3,4-diamine, 4-propan-2-yloxy-1H-pyrrolo[3,2-b]pyrrole, 5-bromo-1,4,5,6-tetrahydropyrrolo[3,2-b]pyrrole, 5-ethynylthieno[3,2-b]thiophene, 5-ethoxy-1H-furo[2,3-d]imidazole, 5-ethoxyfuro[3,2-b]furan, 5-ethoxythieno[3,2-b]furan, 5-ethylfuro[3,2-b]furan, 5-ethylthieno[3,2-b]furan, 5-ethylthieno[3,2-b]thiophene, 5-hexylthieno[3,2-b]thiophene, 5-iodothieno[3,2-b]thiophene, 5-methoxy-1H-furo[2,3-d]imidazole, 5-methoxyfuro[3,2-b]furan, 5-methoxythieno[3,2-b]furan, 5-methyl-1,4-dihydropyrrolo[3,2-b]pyrrole, 5-methyl-4,6-dihydro-1H-pyrrolo[3,4-b]pyrrole, 5-methyl-4H-furo[3,2-b]pyrrole, 5-methyl-4H-thieno[3,2-b]pyrrole, 5-methyl-6H-cyclopenta[c]furan, 5-methyl-6H-cyclopenta[c]thiophene, 5-methylfuro[3,2-b]furan, 5-methylsulfanylthieno[3,2-b]furan, 5-methylsulfanylthieno[3,2-b]thiophene, 5-methylthieno[3,2-b]furan, 5-methylthieno[3,2-b]thiophene, 5-N-ethyl-1H-furo[2,3-d]imidazole-2,5-diamine, 5-N-methyl-1H-furo[2,3-d]imidazole-2,5-diamine, 5-N-methyl-1H-thieno[2,3-d]imidazole-2,5-diamine, 5-octylthieno[3,2-b]thiophene, 5-prop-2-enyl-6H-cyclopenta[c]furan, 5-prop-2-enyl-6H-cyclopenta[c]thiophene, 6-(1,2,3,6-tetrahydropyridin-4-yl)-4H-thieno[3,2-b]pyrrole, 6-fluoro-5-methyl-4H-furo[3,2-b]pyrrole, 6H-cyclopenta[c]furan, 6H-cyclopenta[c]thiophene, 6H-furo[3,2-b]furan-5-one, 6H-furo[3,2-b]pyrrole, 6H-thieno[3,2-b]pyrrole, 6H-thieno[3,4-c]pyrrole, 6-methyl-1,4-dihydropyrrolo[3,2-b]pyrrole, 6-methyl-1H-furo[2,3-d]imidazole, 6-methyl-4H-thieno[3,2-b]pyrrole, 6-methylfuro[3,2-b]furan, 6-methylthieno[3,2-b]furan, 6-methylthieno[3,2-b]thiophene, 6-propan-2-yl-4H-thieno[3,2-b]pyrrole, furo[3,2-b]furan, furo[3,2-b]furan-5-ol, furo[3,2-b]pyrrole-3,4-diamine, furo[3,4-d][1,2]oxazole, N,N-diethyl-2-(4H-furo[3,2-b]pyrrol-2-yl)ethylamine, N,N-dimethyl-1-(4H-thieno[3,2-b]pyrrol-6-yl)methylamine, N,N-dimethyl-2-(4H-thieno[3,2-b]pyrrol-6-yl)ethylamine, N-ethyl-1H-pyrrolo[3,2-b]pyrrole-4-amine, N-methyl-1H-thieno[2,3-d]imidazole-2-amine, thieno[3,2-b]furan, thieno[3,2-b]furan-4-oxide, thieno[3,2-b]thiophene, thieno[3,2-b]thiophe-4-oxide, thieno[3,2-b]thiophene-2,5-dithiol, thieno[3,2-d][1,2]thiazole, thieno[3,4-b]furan, thieno[3,4-d][1,2]thiazole, trimethyl(4H-thieno[3,2-b]pyrrol-6-yl methyl)azanium, etc.

Although the amount of the aforesaid cyclic compound(s) to be added differs depending on the types of the coexisting compounds represented by Formulae (1), (2) and (3) and their own type(s), the cyclic compound(s) may be contained in an amount of 0.001 mass % or greater per the total amount of the solution to be added. Although there is no particular upper limit, it is preferably about 2 mass %.

The treating solution may further contain a buffer comprising a weak acid and any desired alkali species for the purpose of proper pH value regulation and keeping its pH value constant. Although the content of such a buffer may be controlled to the desired amount needed for pH regulation, it should preferably be regulated in such a way as to have no adverse influence on the actions of both the aforesaid main ingredient or surfactant and inhibitor.

Although there is no particular limitation on the weak acid forming a part of the buffer, there is the mention of, for instance, phosphoric acids such as phosphoric acid, condensed phosphoric acid, poly-phosphoric acid and meta-phosphoric acid, carboxyl group-containing organic acids such as citric acid, malonic acid and malic acid, and amino acids. For the alkali species, use may be made of ammonia and amines. Note here that the type of alkali species does not matter.

The treating solution may further contain an organic solvent. The organic solvent is added for the purpose of regulating its relative permittivity and enhancing its treatment performance. For such an organic solvent, by way of example but not by way of limitation, any desired organic solvent may be selected from known materials miscible with water, for instance, isopropyl alcohol, N-methylpyrrolidone, dimethyl sulfoxide, dimethylformamide, methanol, ethanol, butanol, propanol, and ethylene glycol. The content of the organic solvent is usually 0.1 to 90 mass %, and preferably less than 30 mass % per the treating solution.

Herein, the aforesaid surfactant or the additive comprising a combination of that surfactant and the aforesaid cyclic compound(s) is often called the inhibitor. The additive (inhibitor) of the invention may be added to such a treating solution as described above to selectively protect nitrogen-containing silicon compounds from etching or corrosion. The nitrogen-containing silicon compound used herein is a general name for compounds containing nitrogen and silicon optionally with other element(s) such as silicon nitrides ($SiN_x$), silicon oxynitrides ($SiO_xN_y$, where x>y>0) and silicon nitride oxides ($SiN_xO_y$, where x>y>0). It is to be noted that these compounds may depart more or less from their stoichiometric compositions.

The material that is dipped together with such a nitrogen-containing silicon compound in the treating solution for etching or cleaning is preferably an oxygen-containing silicon compound or a carbon-containing silicon compound. The oxygen-containing silicon compound or carbon-containing silicon compound includes silicon oxides ($SiO_x$), silicon carbides (SiCN), SiOF (also called FSG), SiOC, SiOH, and TEOS (tetraethoxysilane), or PSG (phosphorus silicon glass), BPSG (boron phosphor silicate glass) and SOG (spin on glass: $SiO_2$) that contain, or are combined with, these materials, or a material that is used as a semiconductor structure called Low-k or an insulating material. It is to be noted that these compounds may depart more or less from their stoichiometric compositions too.

According to the invention, the etching of silicon nitrides may be inhibited or reduced, and etch selectivity is defined as an index to the etch rate of the silicon nitride compound with respect to the silicon oxide. Specifically, an etch rate ratio between thermally oxidized silicon and CVD-silicon nitride in an aqueous solution of hydrofluoric acid (CVD-silicon nitride etch rate/thermally oxidized silicon etch rate) is defined as etch selectivity. This etch selectivity is less than 1, preferably not greater than 0.8, and more preferably not greater than 0.5 when a solution containing the constituting element(s) of the invention such as the aforesaid surfactant is compared with a reference sample consisting of hydrofluoric acid alone.

The treating solution containing the additive(s) of the invention is preferably applied to a treating step of a process for producing a large scale integration circuit formed on a Si wafer or Si thin film structure or a liquid crystal display thin-film transistor formed on a glass substrate, in which treating step the aforesaid oxygen- or carbon-containing silicon compound(s) and nitrogen-containing silicon compound(s) exist while exposed to view. In particular, the treating solution of the invention lends itself to steps of etching or cleaning the oxygen- or carbon-containing silicon compound(s) that exists in a form of an insulation structure, a passivation structure or etching residues using hydrofluoric acid.

The treating solution of the invention may be used with any of a spray type single wafer processing apparatus, a dip type bath apparatus, and a spray type batch apparatus with no difficulty. To prevent oxidation of the surface of a device, the treatment may be carried out in an atmosphere using a nitrogen gas or other inert gas.

Although there are variations in the conditions involved depending on the type of the insulating film used, the treatment may generally be carried out at 20 to 70° C. for about 0.5 to 40 minutes. However, it is to be noted that there are changes in the optimum conditions depending on the etching conditions for what is etched, the concentration of the additive(s), etc.; the best conditions may be determined as necessary.

It is possible to rinse what has been treated with the treating solution by direct use of water, and it is possible to carry out dipping treatment for a long period of time as well. Note here that the "water" used herein includes pure water, ultrapure water, etc., which may be selectively used as necessary.

EXAMPLES

Some specific embodiments of the invention are now explained with reference to the following examples.

Example 1

Addition of the Anionic Surfactant

Sample 1: (1)-1 isopropyl naphthalenesulfonic acid, Sample 2: (1)-2 diisopropyl naphthalenesulfonic acid, and Sample 3: (1)-4 dibutyl naphthalenesulfonic acid, all as the compounds represented by Formula (1), and Sample 4: (2)-1 a naphthalenesulfonic acid/formalin condensate as the compound represented by Formula (2) were added in an amount of 0.05 mass % to an aqueous solution of hydrofluoric acid having a concentration of 1 mass % to prepare treating solutions. A surfactant-free aqueous solution consisting of hydrofluoric acid alone was also prepared as comparative Sample 0.

A 1,000-nm thick, thermally oxidized silicon (Th—$SiO_2$) was formed on an 8-inch size silicon wafer, and a 600-nm thick silicon nitride (SiN) film was formed by a CVD process to obtain a test piece. Note here that the conditions for forming the respective films are not explained anymore because they have generally been known in the art. The obtained test piece was dipped in the treating solution prepared as described above to measure the etch rates of the respective films. At this time the treating temperature and time were 25° C. and 10 minutes to 30 minutes, respectively. The etch rate ratio was found as the ratio to the etch rate of the surfactant-free comparative sample, and etch selectivity was found as the etch rate of silicon nitride/etch rate of thermally oxidized silicon. The results are tabulated in Table 1.

TABLE 1

| Sample No. | Surfactant | pH | SiN Etch-rate (nm/min) |
| --- | --- | --- | --- |
| 0 | not used | 3 | 0.6 |
| 1 | (1)-1 | 3 | 0.5 |
| 2 | (1)-3 | 3 | 0.5 |
| 3 | (1)-4 | 3 | 0.4 |
| 4 | (2)-1 | 3 | 0.5 |

| Sample No. | $SiO_2$ Etch-rate (nm/min) | Etch-rate ratio | Etch Selectivity |
| --- | --- | --- | --- |
| 0 | 5.6 | — | 0.11 |
| 1 | 5.6 | 0.83 | 0.09 |
| 2 | 5.6 | 0.83 | 0.09 |
| 3 | 5.6 | 0.67 | 0.07 |
| 4 | 5.6 | 0.83 | 0.09 |

From the results of Table 1, it has been found that all the samples having the additive added to them make sure a constant anticorrosion effect on the silicon nitride, and that sample (1)-4 in particular has an improved anticorrosion effect.

Example 2

Estimation of the Cyclic Compound Species

As in Example 1 there was an aqueous solution of hydrofluoric acid provided at a concentration of 1 mass %. (1)-1: Isopropyl naphthalenesulfonic acid was added in an amount of 0.05 mass % to the aqueous solution. Further, such cyclic compounds as shown in Table 2 were added in an amount of 0.1 mass % to that aqueous solution to prepare treating solutions indicated as Samples 21-26. There was also comparative Sample 20 for reference prepared to which any cyclic compound was not added.

Such test pieces as used in Example 1 were dipped in the obtained treating solutions to measure the etch rates of the respective films. As in Example 1, the etch rate ratios and etch selectivity were found from the respective etch rates. The results are tabulated in Table 2.

TABLE 2

| Sample No. | Heterocyclic Compound | pH | SiN Etch-rate (nm/min) |
|---|---|---|---|
| 20 | not used | 3 | 0.5 |
| 21 | A | 3 | 0.2 |
| 22 | B | 3 | 0.3 |
| 23 | C | 3 | 0.2 |
| 24 | D | 3 | 0.1 |
| 25 | E | 3 | 0.2 |
| 26 | F | 3 | 0.2 |

| Sample No. | SiO$_2$ Etch-rate (nm/min) | Etch-rate ratio | Etch Selectivity |
|---|---|---|---|
| 20 | 5.6 | — | 0.09 |
| 21 | 5.6 | 0.4 | 0.04 |
| 22 | 5.6 | 0.6 | 0.05 |
| 23 | 5.8 | 0.4 | 0.03 |
| 24 | 5.6 | 0.2 | 0.02 |
| 25 | 5.6 | 0.4 | 0.04 |
| 26 | 5.6 | 0.4 | 0.04 |

A: imidazole
B: histidine
C: phenylalanine
D: benzimidazole
E: benzotriazole
F: tryptophan From the results of Table 2, it has been found that good results are obtained with all the samples as compared with Example 1, and that Samples 23 and 24 in particular are superior to the rest.

Example 3

Estimation of the Concentration of Cyclic Compounds

Example 2 was repeated with the exception that Sample 24: benzimidazole of the cyclic compounds was added in amounts of 0.001 mass % (Sample 31), 0.005 mass % (Sample 32), 0.01 mass % (Sample 33), 0.05 mass % (Sample 34) and 0.1 mass % (Sample 35) to prepare treating solutions as Samples 31-35. There was comparative Sample 30 for reference provided to which no cyclic compound was added.

Such test pieces as used in Example 1 were dipped in the obtained treating solutions to measure the etch rates of the respective films. As in Example 1, the etch rate ratios and etch selectivity were found from the respective etch rates. The results are tabulated in Table 3.

TABLE 3

| Sample No. | Cyclic Compound (%) | pH | SiN Etch-rate (nm/min) |
|---|---|---|---|
| 30 | 0 | 3 | 0.5 |
| 31 | 0.001 | 3 | 0.4 |
| 32 | 0.005 | 3 | 0.2 |
| 33 | 0.01 | 3 | 0.1 |
| 34 | 0.05 | 3 | 0.1 |
| 35 | 0.1 | 3 | 0.1 |

| Sample No. | SiO$_2$ Etch-rate (nm/min) | Etch-rate ratio | Etch Selectivity |
|---|---|---|---|
| 30 | 5.6 | — | 0.09 |
| 31 | 5.6 | 0.8 | 0.07 |
| 32 | 5.6 | 0.4 | 0.04 |
| 33 | 5.6 | 0.2 | 0.02 |
| 34 | 5.6 | 0.2 | 0.02 |
| 35 | 5.6 | 0.2 | 0.02 |

Heterocylic compound: benzimidazole

From the results of Table 3, it has been found that even Sample 31 (0.001 mass %) works, but Sample 32 (0.005 mass %) works better, with a leveling off in Samples 33-35 (more than 0.01 mass %).

Example 4

Estimation of the Concentration of Surfactant

Benzimidazole was added in an amount of 0.01 mass % to the aqueous solution of hydrofluoric acid having a concentration of 1 mass %, and compound (1)-1 represented by Formula (1): isopropyl-naphthalenesulfonic acid was added to the obtained solution in amounts of 0.001 mass % (Sample 41), 0.005 mass % (Sample 42), 0.01 mass % (Sample 43), 0.02 mass % (Sample 44), 0.03 mass % (Sample 45), 0.05 mass % (Sample 46) and 0.1 mass % (Sample 47) as shown in Table 4 to prepare treating solutions as Samples 41-47. There was comparative Sample 40 for reference provided to which no surfactant was added.

Such test pieces as used in Example 1 were dipped in the obtained solutions to measure the etch rates of the respective films. As in Example 1, the etch rate ratios and etch selectivity were found from the respective etch rates. The results are tabulated in Table 4.

TABLE 4

| Sample No. | Surfactant (%) | SiN Etch-rate (nm/min) |
|---|---|---|
| 40 | 0 | 0.6 |
| 41 | 0.001 | 0.6 |
| 42 | 0.005 | 0.5 |
| 43 | 0.01 | 0.5 |
| 44 | 0.02 | 0.4 |
| 45 | 0.03 | 0.2 |
| 46 | 0.05 | 0.1 |
| 47 | 0.1 | 0.1 |

Surfactant: (1)-1

| Sample No. | SiO$_2$ Etch-rate (nm/min) | Etch-rate ratio | Etch selectivity |
|---|---|---|---|
| 40 | 5.6 | — | 0.11 |
| 41 | 5.6 | 1 | 0.11 |
| 42 | 5.6 | 0.8 | 0.09 |
| 43 | 5.6 | 0.8 | 0.09 |
| 44 | 5.6 | 0.7 | 0.07 |
| 45 | 5.6 | 0.3 | 0.04 |

TABLE 4-continued

| 46 | 5.6 | 0.2 | 0.02 |
| 47 | 5.6 | 0.2 | 0.02 |

From the results of Table 3, it has been found that the surfactant starts to develop its anticorrosion effect in an amount of 0.005 mass %, and that effect becomes noticeable in an amount of 0.02 mass % or greater.

Example 5

Estimation I of the Concentration of Hydrofluoric Acid

Provision was made of aqueous solutions having varying concentrations of hydrofluoric acid: Sample 51 (0.1 mass %), Sample 52 (0.5 mass %), Sample 53 (2 mass %), Sample 54 (5 mass %), Sample 55 (10 mass %) and Sample 56 (15 mass %). Using these samples with and without the inhibitor added to them, the etch rate of silicon nitride films was measured: the etch rate ratios were determined in the presence and absence of the inhibitor. Sample 1: (1)-1 isopropyl naphthalenesulfonic acid represented by Formula (1) as the inhibitor and benzimidazole as the cyclic compound were added in the respective amounts of 0.05 mass % and 0.01 mass %. Provision was also made of silicon nitride film test pieces similar to those in Example 1. Treating conditions, etc. were pursuant to Example 1 too. The results are tabulated in Table 5.

TABLE 5

| Sample No. | Hydrofluoric acid (%) | Inhibitor (used nm/min) | Inhibitor (not used nm/min) |
|---|---|---|---|
| 51 | 0.1 | 0.05 | 0.2 |
| 52 | 0.5 | 0.1 | 0.4 |
| 53 | 2 | 0.2 | 1.3 |
| 54 | 5 | 0.9 | 2.9 |
| 55 | 10 | 2.7 | 5.4 |
| 56 | 15 | 6.5 | 8.7 |

| Sample No. | Etch-Rate Ratio |
|---|---|
| 51 | 0.3 |
| 52 | 0.3 |
| 53 | 0.2 |
| 54 | 0.3 |
| 55 | 0.5 |
| 56 | 0.7 |

From the results of Table 5, it has been found that Sample 53 having a hydrofluoric acid concentration of 2 mass % shows the lowest etch rate ratio: satisfactory results are obtained.

Example 6

Estimation II of the Concentration of Hydrofluoric Acid

As in Example 5, aqueous solutions of hydrofluoric acid having varying concentrations were provided as Sample 61 to Sample 66. In each sample with and without the inhibitor added to it, the etch rates of a silicon nitride film and a silicon oxide film were measured to find etch selectivity in the presence and absence of the inhibitor. The inhibitor used was similar to that used in Example 5, and the silicon nitride film/silicon oxide film test pieces used were equivalent to those used in Example 1. The treating conditions, etc. were pursuant to Example 1 too. The results are tabulated in Table 6.

TABLE 6

| Sample No. | Hydrofluoric acid (%) | Inhibitor | SiN Etch-rate (nm/min) |
|---|---|---|---|
| 61 | 0.1 | (not used) | 0.2 |
|    |     | (used) | 0.05 |
| 62 | 0.5 | (not used) | 0.4 |
|    |     | (used) | 0.1 |
| 63 | 2 | (not used) | 1.3 |
|    |   | (used) | 0.2 |
| 64 | 5 | (not used) | 2.9 |
|    |   | (used) | 0.9 |
| 65 | 10 | (not used) | 5.4 |
|    |    | (used) | 2.7 |
| 66 | 15 | (not used) | 8.7 |
|    |    | (used) | 6.5 |

| Sample No. | SiO$_2$ Etch-Rate (nm/min) | Etch Selectivity |
|---|---|---|
| 61 | 0.2 | 1 |
|    | 0.2 | 0.25 |
| 62 | 2.6 | 0.15 |
|    | 2.6 | 0.04 |
| 63 | 11.9 | 0.11 |
|    | 11.9 | 0.02 |
| 64 | 30.5 | 0.10 |
|    | 30.5 | 0.03 |
| 65 | 67.0 | 0.08 |
|    | 67.0 | 0.04 |
| 66 | 114.5 | 0.08 |
|    | 114.5 | 0.06 |

From the results of Table 6, it has been found that Sample 63 having a hydrofluoric acid concentration of 2 mass % shows the lowest etch electivity: satisfactory results are obtained.

Example 7

Estimation I of pH

The pH value of an aqueous solution containing 10 mass % of ammonium phosphate and 1 mass % of hydrofluoric acid was regulated to provide Sample 71 to Sample 75 having pH values of 2 to 6, as shown in Table 7. The pH values were regulated by use of ammonia water. In each sample with and without the inhibitor added to it, the etch rates of a silicon nitride film and a silicon oxide film were measured to find an etch rate ratio in the presence and absence of the inhibitor. The inhibitor used was similar to that used in Example 5, and the silicon nitride film/silicon oxide film test pieces used were equivalent to those used in Example 1, and consisted only of the silicon nitride film. The treating conditions, etc. were pursuant to Example 1 too. The results are tabulated in Table 7.

TABLE 7

| Sample No. | pH | Inhibitor (used nm/min) | Inhibitor (not used nm/min) | Etch-rate ratio |
|---|---|---|---|---|
| 71 | 2 | 0.2 | 0.8 | 0.3 |
| 72 | 3 | 0.4 | 0.7 | 0.6 |
| 73 | 4 | 0.4 | 0.5 | 0.8 |
| 74 | 5 | 0.3 | 0.4 | 0.8 |
| 75 | 6 | 0.06 | 0.07 | 0.8 |

From the results of Table 7, it has been found that Sample 71 having a pH value of 2 shows the lowest etch rate ratio, and as the pH value grows large, it causes the etch rate ratio to grow high, with no change at pH values of 4 or greater.

Example 8

Estimation II of pH

As in Example 7, the pH values were regulated to provide Sample 81 to Sample 85 having pH values of 2 to 6 as shown in Table 8. In each sample with and without the inhibitor added to it, the etch rates of a silicon nitride film and a silicon oxide film were measured to find etch selectivity in the presence and absence of the inhibitor. The inhibitor used was similar to that used in Example 5, and the silicon nitride film/silicon oxide film test pieces were equivalent to those used in Example 1. The treating conditions, etc. were pursuant to Example 1 too. The results are tabulated in Table 8.

TABLE 8

| Sample No. | pH | Inhibitor | SiN Etch-rate (nm/min) | SiO$_2$ Etch-rate (nm/min) |
|---|---|---|---|---|
| 81 | 2 | (not used) | 0.8 | 7.1 |
|  |  | (used) | 0.2 | 7.1 |
| 82 | 3 | (not used) | 0.7 | 9.8 |
|  |  | (used) | 0.4 | 8.9 |
| 83 | 4 | (not used) | 0.5 | 9.8 |
|  |  | (used) | 0.4 | 8.9 |
| 84 | 5 | (not used) | 0.4 | 7.3 |
|  |  | (used) | 0.3 | 6.9 |
| 85 | 6 | (not used) | 0.07 | 0.2 |
|  |  | (used) | 0.06 | 0.2 |

| Sample No. | Etch Selectivity |
|---|---|
| 81 | 0.11 |
|  | 0.03 |
| 82 | 0.07 |
|  | 0.04 |
| 83 | 0.05 |
|  | 0.04 |
| 84 | 0.05 |
|  | 0.04 |
| 85 | 0.35 |
|  | 0.3 |

From the results of Table 8, it has been found that Sample 81 of pH2 shows the lowest etch selectivity upon addition of the inhibitor, and the etch selectivity grows high with an increasing pH value.

Example 9

Estimation I of the Buffer

A buffer comprising 10 mass % of a weak acid and an alkali species and an aqueous solution containing 1 mass % of hydrofluoric acid were prepared to provide Sample 91 to Sample 94 as shown in Table 9. In each sample with and without the inhibitor added to it, the etch rate of a silicon nitride film was measured to find an etch rate ratio in the presence and absence of the inhibitor. The inhibitor used was similar to that used in Example 5, and the silicon nitride film test pieces used were equivalent to those used in Example 1, and consisted only of the silicon nitride film. The treating conditions, etc. were pursuant to Example 1 too. The results are tabulated in Table 9.

TABLE 9

| Sample No. | Buffer | Inhibitor (used nm/min) | Inhibitor (not used nm/min) | Etch-rate ratio |
|---|---|---|---|---|
| 91 | AP | 0.4 | 0.6 | 0.7 |
| 92 | AC | 0.4 | 0.6 | 0.7 |
| 93 | MA | 0.4 | 0.7 | 0.6 |
| 94 | MA' | 0.3 | 0.7 | 0.4 |

AP: ammonium phosphate
AC: ammonium citrate
MA: malonic acid ammonium
MA': malic acid ammonium From the results of Table 9, it has been found that Sample 94 having malic acid ammonium added to it shows the lowest etch rate ratio, and the etch rate ratio increases in order of Sample 93 and Samples 91 and 92.

Example 10

Estimation II of the Buffer

As in Example 9, the respective buffers were used to provide Sample 101 to Sample 104 as shown in Table 10. In each sample with and without the inhibitor added to it, the etch rates of a silicon nitride film and a silicon oxide film were measured to find etch selectivity in the presence and absence of the inhibitor. The inhibitor used was similar to that used in Example 5, and the silicon nitride film/silicon oxide film test pieces were equivalent to those used in Example 1. The treating conditions, etc. were pursuant to Example 1 too. The results are tabulated in Table 10.

TABLE 10

| Sample No. | Buffer | Inhibitor | SiN Etch-rate (nm/min) | SiO$_2$ Etch-rate (nm/min) |
|---|---|---|---|---|
| 101 | AP | (not used) | 0.6 | 9.9 |
|  |  | (used) | 0.4 | 8.9 |
| 102 | AC | (not used) | 0.6 | 8.3 |
|  |  | (used) | 0.4 | 8.5 |
| 103 | MA | (not used) | 0.7 | 8.8 |
|  |  | (used) | 0.4 | 9.0 |
| 104 | MA' | (not used) | 0.7 | 8.3 |
|  |  | (used) | 0.3 | 8.5 |

| Sample No. | Etch Selectivity |
|---|---|
| 101 | 0.6 |
|  | 0.04 |
| 102 | 0.07 |
|  | 0.06 |
| 103 | 0.08 |
|  | 0.04 |
| 104 | 0.08 |
|  | 0.04 |

AP: ammonium phosphate
AC: ammonium citrate
MA: malonic acid ammonium
MA': malic acid ammonium From the results of Table 10, it has been found that Sample 101 having ammonium phosphate added to it, Sample 103 having malonic acid ammonium added to it, and Sample 104 having malic acid ammonium added to it shows the lowest etch rate ratio upon addition of the inhibitor.

Example 11

Estimation I of the Organic Solvent DMSO

An organic solvent: dimethyl sulfoxide (DMSO) was added to an aqueous solution containing 1 mass % of hydrofluoric acid in such a way as to have such concentrations of 0 to 50 mass % as shown in Table 11, thereby preparing such Sample 110 to Sample 115 as shown in Table 11. In each sample with and without the inhibitor added to it, the etch rate of a silicon nitride film was measured to find an etch rate ratio in the presence and absence of the inhibitor. The inhibitor used was similar to that used in Example 5, and the silicon nitride film test pieces used were equivalent to those used in Example 1, and consisted only of the silicon nitride film. The treating conditions, etc. were pursuant to Example 1 too. The results are tabulated in Table 11.

TABLE 11

| Sample No. | DMSO (%) | Inhibitor (used nm/min) | Inhibitor (not used nm/min) | Etch-rate ratio |
|---|---|---|---|---|
| 110 | 0 | 0.1 | 0.6 | 0.2 |
| 111 | 5 | 0.3 | 0.6 | 0.5 |
| 112 | 10 | 0.4 | 0.5 | 0.8 |
| 113 | 20 | 0.4 | 0.5 | 0.8 |
| 114 | 30 | 0.4 | 0.4 | 1 |
| 115 | 50 | 0.2 | 0.2 | 1 |

From the results of Table 11, it has been found that Sample 110 having no organic solvent (0%) added to it shows the lowest etch rate ratio, and the etch rate ratio grows high in proportion to the content of the organic solvent, while the etch ratio of Sample 114 of 30% in concentration reaches 1.

Example 12

Estimation II of the Organic Solvent DMSO

As in Example 11, such Samples 120 to 125 as shown in Table 12 were prepared. In each sample with and without the inhibitor added to it, the etch rates of a silicon nitride film and a silicon oxide film were measured to find etch selectivity in the presence and absence of the inhibitor. The inhibitor used was similar to that used in Example 5, and the silicon nitride film/silicon oxide film test pieces used were equivalent to those used in Example 1. The treating conditions, etc. were pursuant to Example 1 too. The results are tabulated in Table 12.

TABLE 12

| Sample No. | DMSO (%) | Inhibitor | SiN Etch-rate (nm/min) | SiO$_2$ Etch-rate (nm/min) |
|---|---|---|---|---|
| 120 | 0 | (not used) | 0.6 | 5.6 |
|  |  | (used) | 0.1 | 5.6 |
| 121 | 5 | (not used) | 0.6 | 4.5 |
|  |  | (used) | 0.3 | 4.5 |
| 122 | 10 | (not used) | 0.5 | 3.7 |
|  |  | (used) | 0.4 | 3.7 |
| 123 | 20 | (not used) | 0.5 | 2.4 |
|  |  | (used) | 0.4 | 2.4 |
| 124 | 30 | (not used) | 0.4 | 1.5 |
|  |  | (used) | 0.4 | 1.5 |
| 125 | 50 | (not used) | 0.2 | 0.4 |
|  |  | (used) | 0.2 | 0.4 |

| Sample No. | Etch Selectivity |
|---|---|
| 120 | 0.11 |
|  | 0.02 |
| 121 | 0.13 |
|  | 0.07 |
| 122 | 0.14 |
|  | 0.11 |
| 123 | 0.21 |
|  | 0.17 |
| 124 | 0.27 |
|  | 0.27 |
| 125 | 0.50 |
|  | 0.50 |

From the results of Table 12, it has been found that Sample 120 having no organic solvent (0%) added to it shows the lowest etch selectivity upon addition of the inhibitor, the etch selectivity grows high in proportion to the content of the organic solvent, and the etch selectivity of Sample 124 having an organic solvent content of 30% is the same regardless of the presence or absence of the inhibitor. It has also been found that both the etch rates of Sample 125 having an organic solvent content of 50% get even lower.

Example 13

Estimation I of the Organic Solvent NMP

Zero to 50 mass % of an organic solvent: N-methylpyrrolidone (NMP) were mixed with an aqueous solution of 1 mass % of hydrofluoric acid in such a way as to have such concentrations as shown in Table 13 thereby preparing such Samples 130 to 135 as shown in Table 13. In each sample with and without the inhibitor added to it, the etch rate of a silicon nitride film was measured to find an etch rate ratio in the presence and absence of the inhibitor. The inhibitor used was similar to that used in Example 5, and the silicon nitride film test pieces used were equivalent to those used in Example 1, and consisted only of the silicon nitride film. The treating conditions, etc. were pursuant to Example 1 too. The results are tabulated in Table 13.

TABLE 13

| Sample No. | NMP (%) | Inhibitor (used nm/min) | Inhibitor (not used nm/min) | Etch-rate ratio |
|---|---|---|---|---|
| 130 | 0 | 0.1 | 0.6 | 0.17 |
| 131 | 5 | 0.3 | 0.6 | 0.50 |
| 132 | 10 | 0.3 | 0.5 | 0.60 |
| 133 | 20 | 0.3 | 0.4 | 0.75 |
| 134 | 30 | 0.3 | 0.3 | 1.0 |
| 135 | 50 | 0.2 | 0.2 | 1.0 |

From the results of Table 13, it has been found that Sample 130 having no organic solvent (0%) added to it shows the lowest etch rate ratio, and the etch rate ratio grows high in proportion to the content of the organic solvent, while the etch ratio of Sample 134 of 30% in concentration reaches 1.

Example 14

Estimation II of the Organic Solvent NMP

As in Example 13, such Samples 140 to 145 as shown in Table 14 were prepared. In each sample with and without the inhibitor added to it, the etch rates of a silicon nitride film and a silicon oxide film were measured to find etch selectivity in the presence and absence of the inhibitor. The inhibitor used was similar to that used in Example 5, and the silicon nitride film/silicon oxide film test pieces used were equivalent to those used in Example 1. The treating conditions, etc. were pursuant to Example 1 too. The results are tabulated in Table 14.

TABLE 14

| Sample No. | NMP (%) | Inhibitor | SiN Etch-rate (nm/min) | SiO$_2$ Etch-rate (nm/min) |
|---|---|---|---|---|
| 140 | 0 | (not used) | 0.6 | 5.6 |
|  |  | (used) | 0.1 | 5.6 |
| 141 | 5 | (not used) | 0.6 | 4.4 |
|  |  | (used) | 0.3 | 4.4 |
| 142 | 10 | (not used) | 0.5 | 3.5 |
|  |  | (used) | 0.3 | 3.5 |
| 143 | 20 | (not used) | 0.4 | 2.3 |
|  |  | (used) | 0.3 | 2.3 |
| 144 | 30 | (not used) | 0.3 | 1.4 |
|  |  | (used) | 0.3 | 1.4 |
| 145 | 50 | (not used) | 0.2 | 0.3 |
|  |  | (used) | 0.2 | 0.3 |

| Sample No. | Etch Selectivity |
|---|---|
| 140 | 0.11 |
|  | 0.02 |
| 141 | 0.14 |
|  | 0.07 |
| 142 | 0.14 |
|  | 0.09 |
| 143 | 0.17 |
|  | 0.13 |
| 144 | 0.21 |
|  | 0.21 |
| 145 | 0.67 |
|  | 0.67 |

From the results of Table 14, it has been found that Sample 140 having no organic solvent (0%) added to it shows the lowest etch selectivity upon addition of the inhibitor, the etch selectivity grows high in proportion to the content of the organic solvent, and the etch selectivity of Sample 144 having an organic solvent content of 30% is the same regardless of the presence or absence of the inhibitor. It has also been found that both the etch rates of Sample 145 having an organic solvent content of 50% get even lower.

Example 15

Estimation I of the Organic Solvent Ethylene Glycol

Zero to 50 mass % of an organic solvent ethylene glycol (EG) were mixed with an aqueous solution containing 1 mass % of hydrofluoric acid in such a way as to have such concentrations as shown in Table 15 thereby preparing such Samples 150 to 155 as shown in Table 15. In each sample with and without the inhibitor added to it, the etch rate of a silicon nitride film was measured to find an etch rate ratio in the presence and absence of the inhibitor. The inhibitor used was similar to that used in Example 5, and the silicon nitride film test pieces used were equivalent to those used in Example 1, and consisted only of the silicon nitride film. The treating conditions, etc. were pursuant to Example 1 too. The results are tabulated in Table 15.

TABLE 15

| Sample No. | EG (%) | Inhibitor (used nm/min) | Inhibitor (not used nm/min) | Etch-rate ratio |
|---|---|---|---|---|
| 150 | 0 | 0.1 | 0.6 | 0.17 |
| 151 | 5 | 0.2 | 0.7 | 0.29 |
| 152 | 10 | 0.3 | 0.7 | 0.43 |
| 153 | 20 | 0.5 | 0.7 | 0.71 |
| 154 | 30 | 0.5 | 0.7 | 0.71 |
| 155 | 50 | 0.5 | 0.5 | 1.0 |

From the results of Table 15, it has been found that Sample 150 having no organic solvent (0%) added to it shows the lowest etch rate ratio, and the etch rate ratio grows high in proportion to the content of the organic solvent, while the etch ratio of Sample 155 of 50% in concentration reaches 1.

Example 16

Estimation II of the Organic Solvent Ethylene Glycol

As in Example 15, such Samples 160 to 165 as shown in Table 16 were prepared. In each sample with and without the inhibitor added to it, the etch rates of a silicon nitride film and a silicon oxide film were measured to find etch selectivity in the presence and absence of the inhibitor. The inhibitor used was similar to that used in Example 5, and the silicon nitride film/silicon oxide film test pieces used were equivalent to those used in Example 1. The treating conditions, etc. were pursuant to Example 1 too. The results are tabulated in Table 16.

TABLE 16

| Sample No. | EG (%) | Inhibitor | SiN Etch-rate (nm/min) | SiO$_2$ Etch-rate (nm/min) |
|---|---|---|---|---|
| 160 | 0 | (not used) | 0.6 | 5.6 |
|  |  | (used) | 0.1 | 5.6 |
| 161 | 5 | (not used) | 0.7 | 5.3 |
|  |  | (used) | 0.2 | 5.3 |
| 162 | 10 | (not used) | 0.7 | 4.8 |
|  |  | (used) | 0.3 | 4.8 |
| 163 | 20 | (not used) | 0.7 | 4.1 |
|  |  | (used) | 0.5 | 4.1 |
| 164 | 30 | (not used) | 0.7 | 3.3 |
|  |  | (used) | 0.5 | 3.3 |
| 165 | 50 | (not used) | 0.5 | 1.8 |
|  |  | (used) | 0.5 | 1.8 |

| Sample No. | Etch Selectivity |
|---|---|
| 160 | 0.11 |
|  | 0.02 |
| 161 | 0.13 |
|  | 0.04 |
| 162 | 0.15 |
|  | 0.06 |
| 163 | 0.17 |
|  | 0.12 |
| 164 | 0.21 |
|  | 0.15 |
| 165 | 0.28 |
|  | 0.28 |

From the results of Table 16, it has been found that Sample 160 having no organic solvent (0%) added to it shows the lowest etch selectivity upon addition of the inhibitor, and the etch selectivity grows high in proportion to the content of the organic solvent, while the etch selectivity of Sample 165 of 50% in concentration is the same regardless of the presence or absence of the inhibitor.

Example 17

Estimation I of the Organic Solvent IPA

Zero to 50 mass % of an organic solvent isopropyl alcohol (IPA) were mixed with an aqueous solution containing 1 mass % of hydrofluoric acid in such a way as to have such concentrations as shown in Table 17 thereby preparing such Samples 170 to 175 as shown in Table 17. In each sample with and without the inhibitor added to it, the etch rate of a silicon nitride film was measured to find an etch rate ratio in the presence and absence of the inhibitor. The inhibitor used was similar to that used in Example 5, and the silicon nitride film test pieces used were equivalent to those used in Example 1, and consisted only of the silicon nitride film. The treating conditions, etc. were pursuant to Example 1 too. The results are tabulated in Table 17.

TABLE 17

| Sample No. | IPA (%) | Inhibitor (used nm/min) | Inhibitor (not used nm/min) | Etch-rate ratio |
| --- | --- | --- | --- | --- |
| 170 | 0 | 0.1 | 0.6 | 0.17 |
| 171 | 5 | 0.3 | 0.7 | 0.43 |
| 172 | 10 | 0.3 | 0.6 | 0.5 |
| 173 | 20 | 0.5 | 0.5 | 1.0 |
| 174 | 30 | 0.4 | 0.4 | 1.0 |
| 175 | 50 | 0.3 | 0.3 | 1.0 |

From the results of Table 17, it has been found that Sample 170 having no organic solvent (0%) added to it shows the lowest etch rate ratio, and the etch rate ratio grows high in proportion to the content of the organic solvent, while the etch ratio of Sample 173 of 20% in concentration already reaches 1.

Example 18

Estimation II of the Organic Solvent IPA

As in Example 17, such Samples 180 to 185 as shown in Table 18 were prepared. In each sample with and without the inhibitor added to it, the etch rates of a silicon nitride film and a silicon oxide film were measured to find etch selectivity in the presence and absence of the inhibitor. The inhibitor used was similar to that used in Example 5, and the silicon nitride film/silicon oxide film test pieces used were equivalent to those used in Example 1. The treating conditions, etc. were pursuant to Example 1 too. The results are tabulated in Table 18.

TABLE 18

| Sample No. | IPA (%) | Inhibitor | SiN Etch-rate (nm/min) | SiO₂ Etch-rate (nm/min) |
| --- | --- | --- | --- | --- |
| 180 | 0 | (not used) | 0.6 | 5.6 |
|  |  | (used) | 0.1 | 5.6 |
| 181 | 5 | (not used) | 0.7 | 4.7 |
|  |  | (used) | 0.3 | 4.7 |
| 182 | 10 | (not used) | 0.6 | 3.8 |
|  |  | (used) | 0.3 | 3.8 |
| 183 | 20 | (not used) | 0.5 | 2.8 |
|  |  | (used) | 0.5 | 2.8 |
| 184 | 30 | (not used) | 0.4 | 2.0 |
|  |  | (used) | 0.4 | 2.0 |
| 185 | 50 | (not used) | 0.3 | 1.2 |
|  |  | (used) | 0.3 | 1.2 |

| Sample No. | Etch Selectivity |
| --- | --- |
| 180 | 0.11 |
|  | 0.02 |
| 181 | 0.15 |
|  | 0.06 |
| 182 | 0.16 |
|  | 0.08 |
| 183 | 0.18 |
|  | 0.18 |
| 184 | 0.20 |
|  | 0.20 |
| 185 | 0.25 |
|  | 0.25 |

From the results of Table 18, it has been found that Sample 180 having no organic solvent (0%) added to it shows the lowest etch selectivity upon addition of the inhibitor, and the etch selectivity grows high in proportion to the content of the organic solvent while Sample 183 having an organic solvent concentration of 20% shows the same etch selectivity regardless of the presence or absence of the inhibitor. It has also been found that Samples 184 and 185 having 30% and 50% organic solvent concentrations show etch rates further decreasing in proportion to the content of the organic solvent.

APPLICABILITY TO THE INDUSTRY

The additive of the invention, and the treating solution to which it is added, can preferably be used in the process of producing electronic parts such as semiconductors like memory devices, operator devices, logical operator devices or other LSIs, and display devices such as liquid crystal display devices and organic EL display devices. In particular, the additive and treating solution of the invention are very useful for the case where there is the selective protection of nitrogen-containing silicon compounds needed in the process of producing devices having a structure in which there is a nitrogen-containing silicon compound present in combination with an oxygen-containing, carbon-containing silicon compound.

What is claimed is:

1. An aqueous treating solution for electronic parts comprising:
   1) one or more of anionic surface active agents having the following formulae (1), (2) and (3):

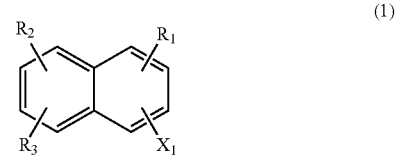

(1)

wherein $R_1$, $R_2$, and $R_3$ stands for hydrogen or an alkyl or alkylene group having 1 to 4 carbon atoms, and $X_1$ stands for a functional group capable of becoming an anionic ion;

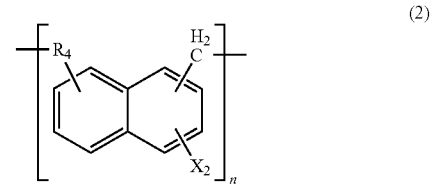

(2)

wherein, $R_4$ stands for hydrogen or an alkyl or alkylene group having 1 to 4 carbon atoms, $X_2$ stands for a functional group capable of becoming an anionic ion, and n stands for a natural number of 2 or greater;

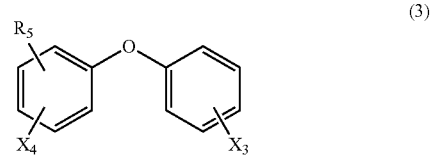

(3)

wherein $R_5$ stands for hydrogen or an alkyl or alkylene group having 1 to 4 carbon atoms, and $X_3$, and $X_4$ stands for a functional group capable of becoming an anionic ion, and 2) a cyclic compound having an occupied area smaller than a naphthalene ring, wherein said cyclic compound is represented by the following formulae (7):

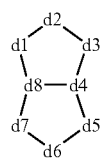

(7)

wherein $d_1$, $d_2$, $d_3$, $d_4$, $d_5$, $d_6$, $d_7$, and $d_8$ stands for any one or more of a carbon atom, a nitrogen atom, an oxygen atom, a sulfur atom and a phosphorus atom, these 8 constituting elements form a cyclic structure by having any chemical bond between neighboring constituting elements, providing a cyclic compound showing aromaticity under conditions under which it is used, or $d_1$, $d_2$, $d_3$, $d_4$, $d_5$, $d_6$, $d_7$, and $d_8$ may further bond to a functional group;

wherein said aqueous solution has a pH value of 2 to 6; which contains hydrofluoric acid in an amount of 0.001 to 50 mass %.

2. The treating solution for electronic parts as recited in claim 1, which contains said cyclic compound in an amount of 0.001 mass % or greater.

3. The treating solution for electronic parts as recited in claim 1, which contains said anionic surface active agent in an amount of 0.001 mass % to 2 mass %.

4. The treating solution for electronic parts as recited in claim 1, wherein said aqueous solution contains a buffer comprising a weak acid and an alkali species.

5. The treating solution for electronic parts as recited in claim 1, which further contains an organic solvent miscible with water.

6. A process for etching a nitrogen containing silicon and nitrogen free silicon containing electronic part comprising:
   etching the nitrogen containing silicon and nitrogen free silicon electronic part with the treating solution for electronic parts recited in claim 1 by contacting the treating solution for electronic parts to the electronic part,
   wherein the etch selectivity of the nitrogen containing silicon over the nitrogen free silicon is not greater than 0.8.

7. The process as recited in claim 6, in which said electronic part is a semiconductor device.

8. The treating solution for electronic parts as recited in claim 1, wherein said electronic part includes a structure having a nitrogen-containing silicon compound as a component material.

9. The treating solution for electronic parts as recited in claim 1, wherein an etch rate ratio between oxidized silicon and silicon nitride in an aqueous solution of hydrofluoric acid is not greater than 0.8.

10. The treating solution for electronic parts as recited in claim 1, wherein the compound represented by formula (1) is naphthalenesulfonic acid, alkyl naphthalenesulfonic acid, naphthalene carboxylate, 2-methyl-1-naphthalenecarboxylic acid, monoisopropyl diisopropyl naphthalenesulfonic acid, triisopropyl naphthalenesulfonic acid, or dibutyl naphthalenesulfonic acid.

11. The treating solution for electronic parts as recited in claim 10, wherein the compound represented by formula (3) is an alkyldiphenyl ether sodium sulfonate, an alkyldiphenyl ether sodium disulfonate, a dodecyldiphenyl ether disulfonic acid or dodecyldiphenyl ether calcium disulfonate.

12. The treating solution for electronic parts as recited in claim 1, wherein the compound represented by formula (3) is alkyldiphenyl ether sodium sulfonate, an alkyldiphenyl ether sodium disulfonate, a dodecyldiphenyl ether disulfonic acid or dodecyldiphenyl ether calcium disulfonate; and
   said one or more of anionic surface active agents have the formulae (1) or (3).

13. The treating solution for electronic parts as recited in claim 1, wherein said one or more of anionic surface active agents have said formulae (2) or (3).

14. The treating solution for electronic parts as recited in claim 1, wherein the compound represented by formula (3) is an alkyldiphenyl ether sodium sulfonate and an alkyldiphenyl ether sodium disulfonate, a dodecyldiphenyl ether disulfonic acid, dodecyldiphenyl ether calcium disulfonate; and wherein said one or more of anionic surface active agents have said formulae (3).

15. The treating solution for electronic parts as recited in claim 1, wherein said hydrofluoric acid is obtained by dissolution of a water-soluble fluoride salt.

16. The process for producing electronic parts as recited in claim 6, wherein the electronic part nitrogen free silicon is an oxygen-containing silicon compound or a carbon-containing silicon compound.

17. The process for producing electronic parts as recited in claim 6, wherein the electronic part nitrogen free silicon is silicon oxides ($SiO_x$), silicon carbides (SiCN), SiOF, SiOC, SiOH, tetraethoxysilane, phosphorus silicon glass, boron phosphor silicate glass and spin on glass: $SiO_2$.

18. The process for producing electronic parts as recited in claim 6, wherein the etch ratio is not greater than 0.5.

* * * * *